US012628383B2

(12) United States Patent
Maxey et al.

(10) Patent No.: US 12,628,383 B2
(45) Date of Patent: May 12, 2026

(54) TRANSISTORS HAVING STACKED 2D MATERIAL CHANNEL LAYERS AND HETEROGENEOUS 2D MATERIAL CONTACTS LAYERS EPITAXIAL TO THE 2D MATERIAL CHANNEL LAYERS

(71) Applicant: Intel Corporation, Santa Clara, CA (US)

(72) Inventors: Kirby Maxey, Hillsboro, OR (US); Ashish Verma Penumatcha, Beaverton, OR (US); Carl Naylor, Portland, OR (US); Chelsey Dorow, Portland, OR (US); Kevin O'Brien, Portland, OR (US); Shriram Shivaraman, Hillsboro, OR (US); Tanay Gosavi, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 505 days.

(21) Appl. No.: 17/485,160

(22) Filed: Sep. 24, 2021

(65) Prior Publication Data

US 2023/0099814 A1     Mar. 30, 2023

(51) Int. Cl.
*H10D 30/67*        (2025.01)
*H01L 21/02*        (2006.01)
(Continued)

(52) U.S. Cl.
CPC ..... *H10D 48/362* (2025.01); *H01L 21/02568* (2013.01); *H01L 21/0259* (2013.01);
(Continued)

(58) Field of Classification Search
CPC ............. H10D 48/362; H10D 30/6735; H10D 30/6757; H10D 62/118; H10D 62/80;
(Continued)

(56) References Cited

U.S. PATENT DOCUMENTS

| | | | |
|---|---|---|---|
| 10,388,732 B1 * | 8/2019 | Frougier | ............ H10D 30/6744 |
| 2016/0020305 A1 | 1/2016 | Obradovic et al. | |
| 2016/0300958 A1 * | 10/2016 | Park | ...................... H10D 30/47 |
| 2019/0131437 A1 | 5/2019 | Le et al. | |

(Continued)

FOREIGN PATENT DOCUMENTS

EP        3985740        4/2022

OTHER PUBLICATIONS

Shen, Pin-Chun, et al. , "Ultralow contact resistance between semimetal and monolayer semiconductors", Nature, vol. 593, May 13, 2021, 21 pgs.

(Continued)

*Primary Examiner* — Lex H Malsawma
*Assistant Examiner* — Ethan Edward Cutler
(74) *Attorney, Agent, or Firm* — Essential Patents Group, LLP

(57)        ABSTRACT

Transistors, devices, systems, and methods are discussed related to transistors including 2D material channels and heterogeneous 2D materials on the 2D material channels and coupled to source and drain metals, and their fabrication. The 2D material channels of the transistor allow for gate length scaling, improved switching performance, and other advantages and the heterogeneous 2D materials improve contact resistance of the transistor devices.

21 Claims, 19 Drawing Sheets

(51) Int. Cl.

| | |
|---|---|
| *H01L 21/443* | (2006.01) |
| *H10D 48/36* | (2025.01) |
| *H10D 62/10* | (2025.01) |
| *H10D 62/80* | (2025.01) |
| *H10D 64/62* | (2025.01) |
| *H10D 99/00* | (2025.01) |

(52) U.S. Cl.
CPC ....... *H01L 21/443* (2013.01); *H10D 30/6735* (2025.01); *H10D 30/6757* (2025.01); *H10D 62/118* (2025.01); *H10D 62/80* (2025.01); *H10D 64/62* (2025.01); *H10D 99/00* (2025.01)

(58) Field of Classification Search
CPC ........ H10D 64/62; H10D 99/00; H10D 30/47; H10D 30/675; H10D 30/6755; H10D 62/121; H10D 62/151; H10D 64/512; H01L 21/02568; H01L 21/0259; H01L 21/443; B82Y 10/00
See application file for complete search history.

(56) References Cited

U.S. PATENT DOCUMENTS

| | | |
|---|---|---|
| 2019/0287800 A1 | 9/2019 | Yamaguchi |
| 2020/0058743 A1 | 2/2020 | Li et al. |

OTHER PUBLICATIONS

Wang, Brian, "Breakthrough Toward Below 1 Nanometer Chips", <https://www.nextbigfuture.com/2021/05/breakthrough-to-below-1-nanometer-chips.html> May 21, 2021, 8 pgs.
Extended European Search Report from European Patent Application No. 22184579.5 notified Dec. 14, 2022, 9 pgs.

\* cited by examiner

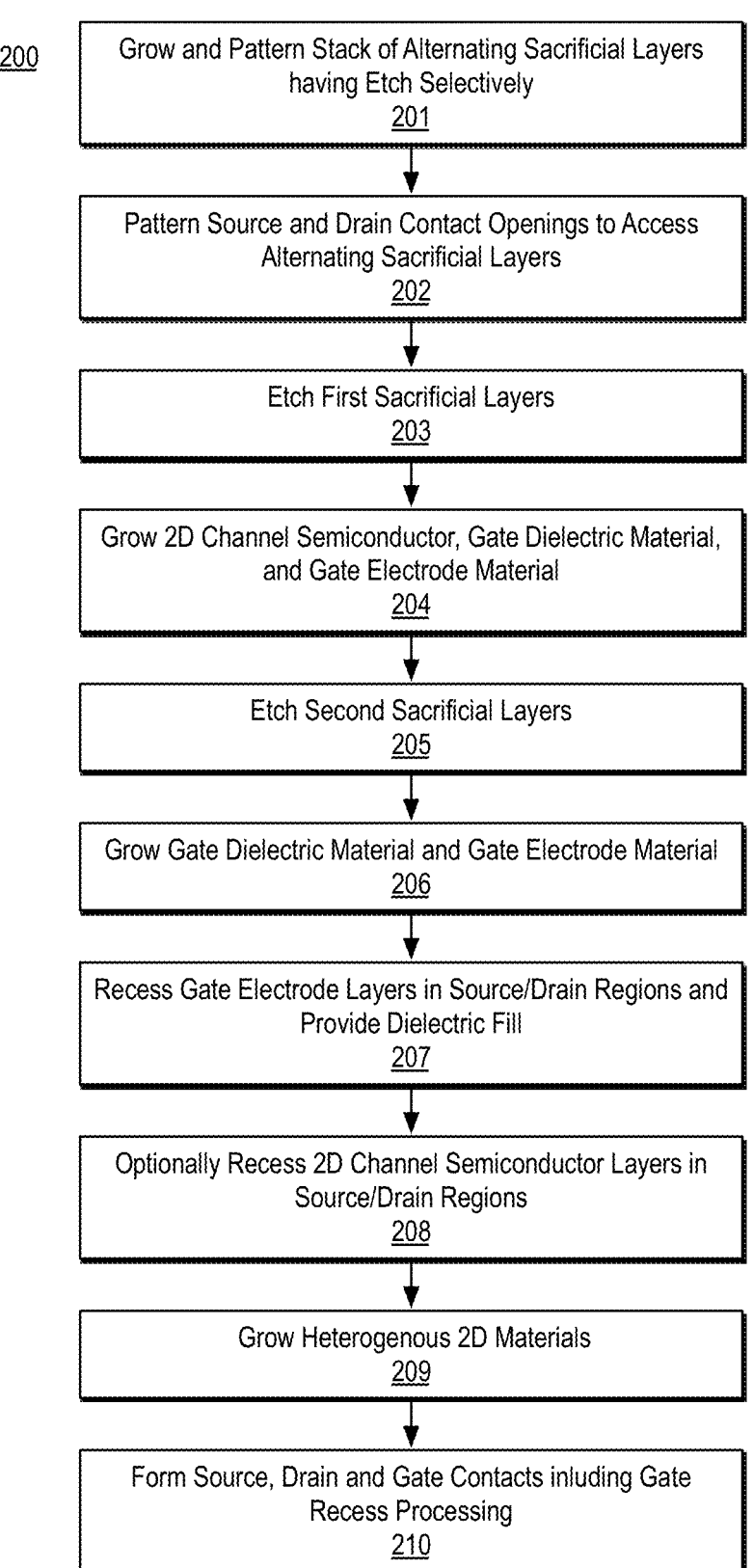

200

Grow and Pattern Stack of Alternating Sacrificial Layers having Etch Selectively
201

Pattern Source and Drain Contact Openings to Access Alternating Sacrificial Layers
202

Etch First Sacrificial Layers
203

Grow 2D Channel Semiconductor, Gate Dielectric Material, and Gate Electrode Material
204

Etch Second Sacrificial Layers
205

Grow Gate Dielectric Material and Gate Electrode Material
206

Recess Gate Electrode Layers in Source/Drain Regions and Provide Dielectric Fill
207

Optionally Recess 2D Channel Semiconductor Layers in Source/Drain Regions
208

Grow Heterogenous 2D Materials
209

Form Source, Drain and Gate Contacts inluding Gate Recess Processing
210

TRANSISTORS HAVING STACKED 2D MATERIAL CHANNEL LAYERS AND HETEROGENEOUS 2D MATERIAL CONTACTS LAYERS EPITAXIAL TO THE 2D MATERIAL CHANNEL LAYERS

BACKGROUND

Demand for integrated circuits (ICs) in electronic applications has motivated research into new materials for advanced transistor devices. For example, materials to replace the silicon channel of traditional transistors are being sought. In particular, scaling silicon to extremely small channel lengths and thicknesses is unworkable as the behavior of the silicon material changes at such dimensions. Replacement channel materials include 2D materials inclusive of transition metal dichalcogenides (TMD) and similar materials. However, challenges arise in deploying 2D materials. For example, 2D transistors suffer from contact resistances that are at best an order of magnitude higher than what is needed for high-performance devices. Such high contact resistances are due to the inability to selectively dope contact regions and other concerns. Notably, 2D materials have the promise of outperforming silicon and III-V materials for gate lengths of less than 10 nm due to decreased short channel effects but current shortcomings must be resolved.

It is desirable to deploy transistors with 2D channel materials for improved device performance It is with respect to these and other considerations that the present improvements have been needed. Such improvements may become critical as the need for higher performance integrated circuit electronic devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 illustrates a flow diagram illustrating an example process for fabricating transistor structures having semiconductor channel layers and contact layers of heterogeneous 2D materials;

DETAILED DESCRIPTION

Figures 1A, 1B, 1C:
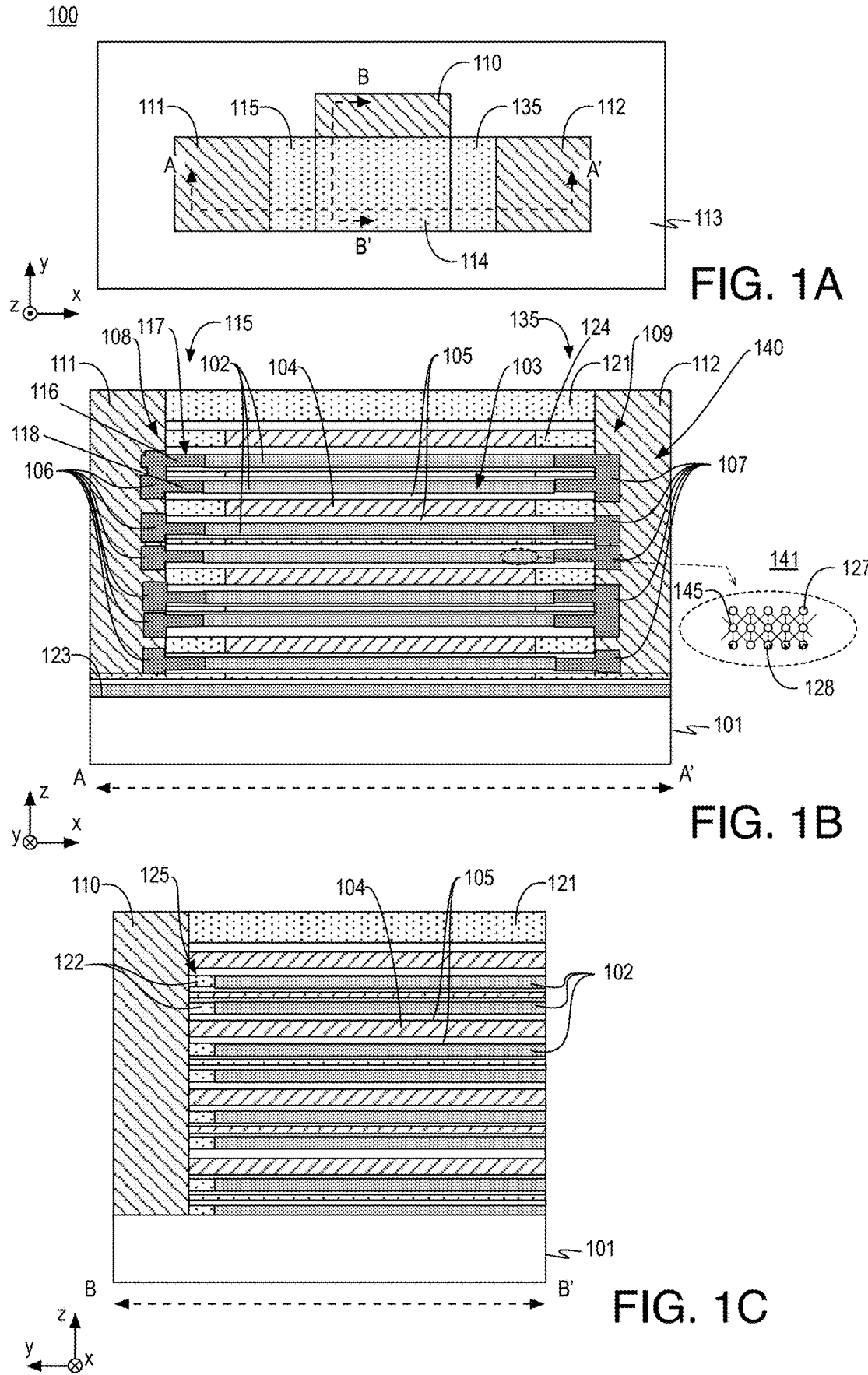
FIG. 1A illustrates a top down view of an exemplary transistor structure having semiconductor channel layers and contact layers of heterogeneous 2D materials.
FIG. 1B provides illustration of a cross-sectional side view of the transistor structure of FIG. 1A taken along the channel thereof.
FIG. 1C provides illustration of a cross-sectional side view of the transistor structure of FIG. 1A taken across the gate thereof.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures, device structures, apparatuses, integrated circuits, computing platforms, and methods are described herein related to transistors having a number of 2D material channel semiconductors and a heterogeneous 2D material on the 2D material channel semiconductors for improved device performance.

As discussed, it is desirable to reduce contact resistance in 2D transistors. Embodiments discussed herein provide 2D transistors having intrinsic channel quality 2D materials and heterogeneous 2D contact materials for reduced contact resistance. Notably, the transistor includes a multilayer stack of interleaved channel semiconductor material layers and gate layers such that the channel semiconductor material layers provide high quality semiconductor performance (e.g., intrinsic channel quality) while the number of such channel semiconductor layers provides sufficient drive current. The interleaved gate layers include gate dielectric layers on opposite surfaces of the channel semiconductor material layers and a gate electrode between the gate dielectric layers. The channel semiconductor material layers are of a first 2D material and are contacted by a heterogeneous 2D material. As used herein, the term 2D material indicates a crystalline solid made up of any number of layers of single 2D layers (e.g., monolayers or nano sheets) such as one, two, three, or more 2D layers with one or two layers being particularly advantageous. The heterogeneous 2D material provides a material that lowers contact resistance (when contacted by source and drain contact metal) for the transistor structure relative to contacting the channel semiconductor material layers directly.

The contact layer (i.e., the 2D material) may be heterogeneous relative to the semiconductor material layers in any suitable manner such as having some or all of the constituents thereof being different atoms, having a same underlying crystalline material with higher dopant concentration, being an alloy of 2D materials, being (semi-)metallic, or others as discussed herein. In some embodiments, the semiconductor material layers are intrinsic channel quality semiconductor materials. In some embodiments, the heterogeneous 2D material is a higher conductivity material. The heterogeneous 2D material(s) contacting the semiconductor material layers may be characterized as source and drain regions or as contact layers. The term contact layers is typically used herein for the sake of clarity of presentation.

Notably, doping the semiconductor material layers in the same manner as the contact layers prevents the material from achieving low OFF currents due to shifting the Fermi level towards more free carriers not only in the contact regions but also in channel regions, thereby preventing the gate from turning the channel off. Intrinsic semiconductor materials can be adequately gated to adequate OFF currents (e.g., below 1 pA/μm), but ON currents are currently not workable (e.g., ~10 μA/μm) for the same drain bias. Embodiments discussed herein provide an integration scheme that allows for stacked semiconductor material layers (e.g., nanoribbon channels) of 2D materials with heterogeneous 2D contact materials that are fully compatible with the 2D semiconductor materials. Thereby, lower contact resistance and other advantages are provided in the resultant transistor. In some embodiments, alternating sacrificial materials (e.g., dielectric materials) that can be selectively etched are alternately deposited, selectively removed, and filled in with the 2D semiconductor and gate dielectric/gate electrode stacks. The 2D heterogeneous contact material is subsequently formed on exposed portions of the 2D semiconductor. In some embodiments, the 2D heterogeneous contact material is epitaxial to the 2D semiconductor and forms laterally from the 2D semiconductor. Using such techniques, 2D semiconductor channel transistor structures are formed. The 2D semiconductors (e.g., monolayer 2D semiconductors) allow for gate length scaling bellow 10 nm without significant short channel effects such as drain-induced barrier lowering (DIBL) or band-to-band tunneling (BTBT), which can lead to more transistors per unit area and/or lower power chips for increased functionality. Other advantages will be evident based on the description provided herein.

FIGS. 1A, 1B, and 1C provide illustrative views of an exemplary transistor structure 100 having semiconductor channel layers and contact layers of heterogeneous 2D materials, arranged in accordance with at least some implementations of the present disclosure. FIG. 1A illustrates a top down view of transistor structure 100, FIG. 1B illustrates a cross-sectional side view of transistor structure 100 taken along the A-A' plane illustrated in FIG. 1A (e.g., along the channel of transistor structure 100), and FIG. 1C illustrates a cross-sectional side view of transistor structure 100 taken along the B-B' plane illustrated in FIG. 1A (e.g., across the gate of transistor structure 100). Such convention is maintained in subsequent FIGS. 3 to 17.

Transistor structure 100 includes a field insulator 113 (e.g., an oxide) over substrate 101 with a source contact 111, a material stack 140, a drain contact 112, and a gate contact 110 within an opening of field insulator 113. Gate contact 110 contacts gate electrode layers 104, source contact 111 contacts contact structures or layers 106, and drain contact 112 contacts contact structures or layers 107 such that contact layers 106 and contact layers 107 are on opposite lateral ends 108, 109 of semiconductor channel layers 102. Notably, a number of dielectric fills or plugs 124 are provided between source contact 111 and gate electrode layers 104 and between drain contact 112 and gate electrode layers 104 such that no short is provided therebetween. Similarly, a number of dielectric fills or plugs 122 are provided between gate contact 110 and semiconductor channel layers 102 such that no short is provided therebetween. As used herein, the term lateral indicates a direction substantially parallel to a surface 123 of substrate 101 and perpendicular to a build up direction of transistor structure 100. For example, the lateral direction is in the x-y plane and the build up direction is in the direction of the z-axis defined in FIGS. 1 and 3 to 17.

Source contact 111, drain contact 112, and gate contact 110 may include any suitable material(s) and may be formed together (as illustrated herein below for the sake of clarity of presentation) or with gate contact 110 being formed in separate operations with respect to source contact 111 and drain contact 112. In some embodiments, gate contact 110 includes a gate material selected to provide a work function material suitable for transistor structure 100. In some embodiments, source contact 111 and drain contact 112 include one or more noble metals such as gold, silver, platinum, or palladium. Other materials may be used. Notably, gate contact 110, source contact 111, and drain contact 112 may be polycrystalline materials while the materials of contact layers 106, 107 and semiconductor channel layers 102 are substantially crystalline. As used herein the term crystalline indicates a solid having a highly (although not necessarily perfectly) ordered structure such as a crystalline lattice structure.

Substrate 101 may include any suitable material or materials. In some embodiments, substrate 101 includes a Group IV material (e.g., silicon). In some embodiments, substrate 101 is a substantially monocrystalline material. Material stack 140 includes a stack of layers including alternating or interleaving semiconductor channel layers 102 and gate layers 103 therebetween with each of gate layers 103 including a gate electrode layer 104 between gate dielectric layers 105, as well as a capping layer 121. Gate electrode layers 104 may include any gate metal (GM) material. Examples of gate electrode layer 104 materials include metals such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, hafnium carbide, zirconium carbide, titanium carbide, tantalum carbide or aluminum carbide. Gate dielectric layers 105 may include any dielectric materials such as high-k (HK) dielectric materials. Examples of gate dielectric layers 105 materials hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide or lead zinc niobate. Other materials may be deployed.

Each of semiconductor channel layers 102 includes one or more monolayers of 2D material. As discussed, a 2D material indicates a crystalline solid made up of any number of monolayers. Examples of semiconductor channel layers 102 materials include transition metal dichalcogenide layers (e.g., including a lattice of transition metal atoms and chalcogen atoms exclusive of oxygen) and similar materials such as indium selenide. Other 2D material layers may be used. In some embodiments, semiconductor channel layers 102 include a transition metal dichalcogenide (TMD) inclusive of a transition metal and a chalcogen. Such TMD material may be doped or undoped. Examples of TMD materials that exhibit N-type behavior include sulfides of Mo or W. Examples of TMD materials that exhibit P-type includes, for example, $WSe_2$ or $WSe_2$ doped with Ta. In some embodiments, semiconductor channel layers 102 include molybdenum disulfide (e.g., stoichiometric molybdenum and sulfur, $MoS_2$). In some embodiments, semiconductor channel layers 102 include tungsten disulfide (e.g., stoichiometric tungsten and sulfur, $WS_2$). In some embodiments, semiconductor channel layers 102 include molybdenum diselenide (e.g., stoichiometric molybdenum and selenium, $MoSe_2$). In some embodiments, semiconductor channel layers 102 include tungsten diselenide (e.g., stoichiometric tungsten and selenium, $WSe_2$). In some embodiments, semiconductor channel layers 102 include a 2D material other than TMD. In some embodiments, semiconductor channel layers 102 include indium selenide (e.g., stoichiometric indium and selenium, InSe or $In_2Se_3$).

FIG. 1B includes an insert 141 providing a schematic of a monolayer of TMD material, according to some embodiments. In the illustrative embodiment of insert 141, the TMD material includes a layer of transition metal atoms 145 between layers of chalcogen atoms 127, 128. Depending on arrangements of transition metal atoms 145 and chalcogen atoms 127, 128, the TMD material may have various crystal orientations: trigonal prismatic (hexagonal, as shown, 1H or 2H), octahedral (tetragonal, 1T), or their distorted phase (1T'). A monolayer of TMD (e.g., a TMD nanosheet) may have a thickness of not more than 1 nm. Semiconductor channel layers 102 (e g , channel nanoribbons) may have one or more such monolayers or nanosheets and semiconductor channel layers 102 may each have a thickness of not more than 2 nm in some embodiments. Each of semiconductor channel layers 102 may be characterized as a nanoribbon, a sheet, or the like.

With continued reference to FIG. 1B, semiconductor channel layers 102 each couple to one of contact structures or layers 106 and one of contact structures or layers 107, which are on opposite lateral ends 108, 109 of semiconductor channel layers 102. Contact layers 106, 107 are grown from and are epitaxial to semiconductor channel layers 102 such that they have a substantially matched crystalline structure with respect to semiconductor channel layers 102. As shown, contact layers 106, 107 may be discontinuous (e.g., having portions of source contact 111 or drain contact 112 therebetween) or they may bridge between adjacent semiconductor channel layers 102. In the example of FIG. 1B, one bridging contact layer 106 and two bridging contact layers 107 are illustrated, however any number of contact layers 106, 107 may bridge between adjacent semiconductor channel layers 102. In some embodiments, none of contact layers 106, 107 bridge adjacent semiconductor channel layers 102 (e.g., each of semiconductor channel layers 102 has one contact layer 106 and one contact layer 107 thereon). In some embodiments, a single contact layer 106 bridges all channel layers 102 and a single contact layer 107 bridges all semiconductor channel layers 102.

In the example of FIG. 1B, at least a portion of each of contact layers 106, 107 is within a recess between adjacent ones of gate dielectric layers 105 such that the adjacent ones of gate dielectric layers 105 are on opposite surfaces (e.g., horizontal surfaces) of the same semiconductor channel layer 102. For example, as shown with respect to the top-most contact structure or layer 106, a portion 116 (e.g., part or region) of the relevant contact layer 106 is within a recess 117 that is vertically between a first of gate dielectric layers 105 on a top surface of the relevant contact layer 106 and a second of gate dielectric layers 105 on a bottom surface of the relevant contact layer 106. Portion 116 is also lateral with respect to the top-most semiconductor channel layer 102. Similarly, another portion 118 (e.g., part or region) of the relevant contact layer 106 is within another recess (not labeled) that is lateral to the second top-most semiconductor channel layer 102 and between gate dielectric layers thereon. Similarly, each of contact layers 106, 107 includes a portion that is lateral with respect to one of semiconductor channel layers 102 and between gate dielectric layers 105 on opposite surfaces of the relevant semiconductor channel layer 102. Such lateral growth within recesses is illustrated with respect to each of semiconductor channel layers 102 and is discussed further herein below. Alternatively, such recessing may be bypassed and contact layers 106, 107 may be lateral to semiconductor channel layers 102 and on sidewalls of material stack 140, as discussed further herein with respect to FIGS. 13A, 13B, and 13C. It is noted that such recessing provides improved device performance at the cost of manufacturing complexity.

Notably, in FIG. 1B, such recessing of contact layers 106, 107 provides contact regions 115, 135 where transition is made from source contact 111 to contact layer(s) 106 to a channel region 114 including semiconductor channel layers 102 as well as from drain contact 112 to contact layer(s) 107 to channel region 114. Such transitions inclusive of contact structures or layers 106, 107 provide reduced contact resistance and improved transistor performance for transistor structure 100. For example, contact structures or layers 106, 107 include a heterogeneous 2D material on semiconductor channel layers 102 that contacts source contact 111 and drain contact 112 for reduced contact resistance while maintaining high quality intrinsic semiconductor characteristics of semiconductor channel layers 102.

In some embodiments, semiconductor channel layers 102 include a material having a band-structure and filling of states to provide an intrinsic semiconductor. In some embodiments, contact structures or layers 106, 107 include a highly doped, metallic, or alloyed materials. For highly doped materials, the band-structure and filling of states of contact structures or layers 106, 107 will provide a p- or n-type semiconductor (e.g., with Fermi level very close to one of the band edges). For metallic contact structures or layers 106, 107, the band-structure will be that of a metal. For alloyed materials deployed for contact structures or layers 106, 107, a mix of semiconductor and metal is used to provide a band-structure of a semimetal band-structure. In such examples, the band gap gets smaller but is not necessarily completely closed, or it may cross at differing a point in momentum space.

In some embodiments, contact structures or layers 106, 107 include a 2D material (as discussed above with respect to semiconductor channel layers 102) having a higher dopant concentration. For example, semiconductor channel layers 102 may have no dopant concentration or a very low dopant concentration while contact structures or layers 106, 107 includes a substantially higher dopant concentration. In some embodiments, contact structures or layers 106, 107 include a dopant and semiconductor channel layers 102. In some embodiments, contact structures or layers 106, 107 have a dopant concentration of not less than 100 times, 1,000 times, or more than that of semiconductor channel layers 102. The dopant deployed may include any suitable dopant material including one or more of vanadium (V), niobium (Nb), manganese (Mn), rhenium (Re), phosphorus (P), arsenic (As), antimony (Sb), or bromine (Br). Such dopants may be deployed based on the type of transistor (n-type or p-type) and may be incorporated using any suitable technique or techniques such as in situ doping during growth of contact structures or layers 106, 107.

In some embodiments, contact structures or layers 106, 107 include one or more 2D metals either substantially pure or alloyed with a 2D material semiconductor, which may be the same material as that of semiconductor channel layers 102 or a different material with respect to semiconductor channel layers 102. In some embodiments, contact structures or layers 106, 107 include niobium disulfide (e.g., stoichiometric niobium and sulfur, $NbS_2$) In some embodiments, contact structures or layers 106, 107 include tantalum sulfide (e.g., stoichiometric tantalum and sulfur, $TaS_2$) In some embodiments, contact structures or layers 106, 107 include tungsten ditelluride (e.g., stoichiometric tungsten and tellurium, $WTe_2$). In some embodiments, contact structures or layers 106, 107 include molybdenum ditelluride (e.g., stoichiometric molybdenum and tellurium, $MoTe_2$). Such materials (e.g., niobium disulfide, tantalum sulfide, tungsten ditelluride, or molybdenum ditelluride) may be alloyed with any material discussed with respect to semiconductor channel layers 102. Such materials may also have hexagonal or tetragonal phases, which may affect their band structure. For example, $MoTe_2$ in the hexagonal phase is a semiconductor and may be deployed in semiconductor channel layers 102. However, $MoTe_2$ may be grown in a tetragonal phase, which is metallic, and may be used in contact structures or layers 106, 107.

As discussed, transistor structure 100 includes a number of semiconductor channel layers 102 interleaved with a number of gate layers 103. In some embodiments, each of gate layers 103 includes a gate electrode layer (e.g., one of gate electrode layers 104) and a gate dielectric layer (e.g., one or two of gate dielectric layers 105) between the gate electrode layer and the adjacent semiconductor channel layers 102, if applicable, such that the semiconductor channel layers are or include a first 2D material. The first 2D material may be any discussed herein with respect to semiconductor channel layers 102 such as $MoS_2$, $WS_2$, $MoSe_2$, $WSe_2$, InSe, or others. Semiconductor channel layers 102 include two or more of such layers. In some embodiments, three, four, or more semiconductor channel layers 102 are used. In some embodiments, five to ten semiconductor channel layers 102 are implemented in transistor structure 100 (with seven being illustrated). However, more may be used. Transistor structure 100 further includes one or more first contact structures or layers 106 and one or more second contact structures or layers 107 on opposite lateral ends 108, 109, respectively of semiconductor channel layers 102 such that contact structures or layers 106, 107 are or include a second 2D material. The second 2D material may be any discussed herein with respect to contact structures or layers 106, 107 such as highly doped materials of the same base (e.g., $MoS_2$, $WS_2$, $MoSe_2$, $WSe_2$, or InSe doped with one or more of V, Nb, Mn, Re, P, As, Sb, and Br), an alloy of one of the materials and a metal 2D material (e.g., $MoS_2$, $WS_2$, $MoSe_2$, $WSe_2$, or InSe alloyed with one or more of $NbS_2$, $TaS_2$, $WTe_2$, and $MoTe_2$), or a metallic 2D material (e.g., $NbS_2$, $TaS_2$, $WTe_2$, or $MoTe_2$).

Notably, monolayer 2D materials such as those discussed with respect to semiconductor channel layers 102 have band gaps and effective masses larger than other channel materials including silicon, which enables the transistor structures to be turned off at ultra-short gate lengths while contact structures or layers 106, 107 allow semiconductor channel layers 102 to maintain such characteristics (e.g., being electrically intrinsic at such dimensions) and reduced contact resistance when contacted with metal plugs such as source contact 111 and drain contact 112. For example, the Fermi level of contact structures or layers 106, 107 may be moved into the conduction (or valence) band for increased carrier concentration and very low resistance.

FIG. 2 illustrates a flow diagram illustrating an example process 200 for fabricating transistor structures having semiconductor channel layers and contact layers of heterogeneous 2D materials, arranged in accordance with at least some implementations of the present disclosure. For example, process 200 may be implemented to fabricate transistor structure 100 or any other transistor structure discussed herein. In the illustrated embodiment, process 200 includes one or more operations as illustrated by operations 201-210. However, embodiments herein may include additional operations, certain operations being omitted, or operations being performed out of the order provided. In an embodiment, process 200 may fabricate transistor structure 1000 or a similar transistor structure having a differing material stack structure as discussed further herein with respect to FIGS. 13A, 13B, and 13C.

FIGS. 3A, 4A, 5A, 6A, 7A, 8A, 9A, 10A, 11A, 12A, 13A, 14A, 15A, 16A, and 17A illustrate top down views of example transistor structures, FIGS. 3B, 4B, 5B, 6B, 7B, 8B, 9B, 10B, 11B, 12B, 13B, 14B, 15B, 16B, and 17B illustrate cross-sectional side views of such transistor structures taken along the A-A' plane, and FIGS. 3C, 4C, 5C, 6C, 7C, 8C, 9C, 10C, 11C, 12C, 13C, 14C, 15C, 16C, and 17C illustrate cross-sectional side views of such transistor structures taken along the B-B' plane, as particular fabrication operations are performed to generate transistor structures having semiconductor channel layers and contact layers of heterogeneous 2D materials, arranged in accordance with at least some implementations of the present disclosure. In particular, reference will be made to FIGS. 3 to 17 in the context of process 200.

Process 200 begins at operation 201, where a stack of alternating sacrificial layers are grown and patterned over a substrate such that the alternating sacrificial layers have an etch selectivity therebetween. The stack of alternating sacrificial layers may be grown and patterned using any suitable technique or techniques. In some embodiments, a field insulator 113 (e.g., field oxide) is bulk deposited and patterned over a substrate to form openings or exposed substrate regions such that the stack of alternating sacrificial layers are formed therein. Other techniques may be used. The stack of alternating sacrificial layers may include any materials that have an etch selectivity therebetween. In some embodiments, alternating dielectric layers having etch selectivity therebetween are deployed. In some embodiments, the first sacrificial layer is aluminum nitride and the second sacrificial layer is gallium nitride. In some embodiments, the first sacrificial layer is an oxide (e.g., a silicon oxide) and the second sacrificial layer is a nitride (e.g., a silicon nitride). Other materials systems may be used.

Figures 3A, 3B, 3C:
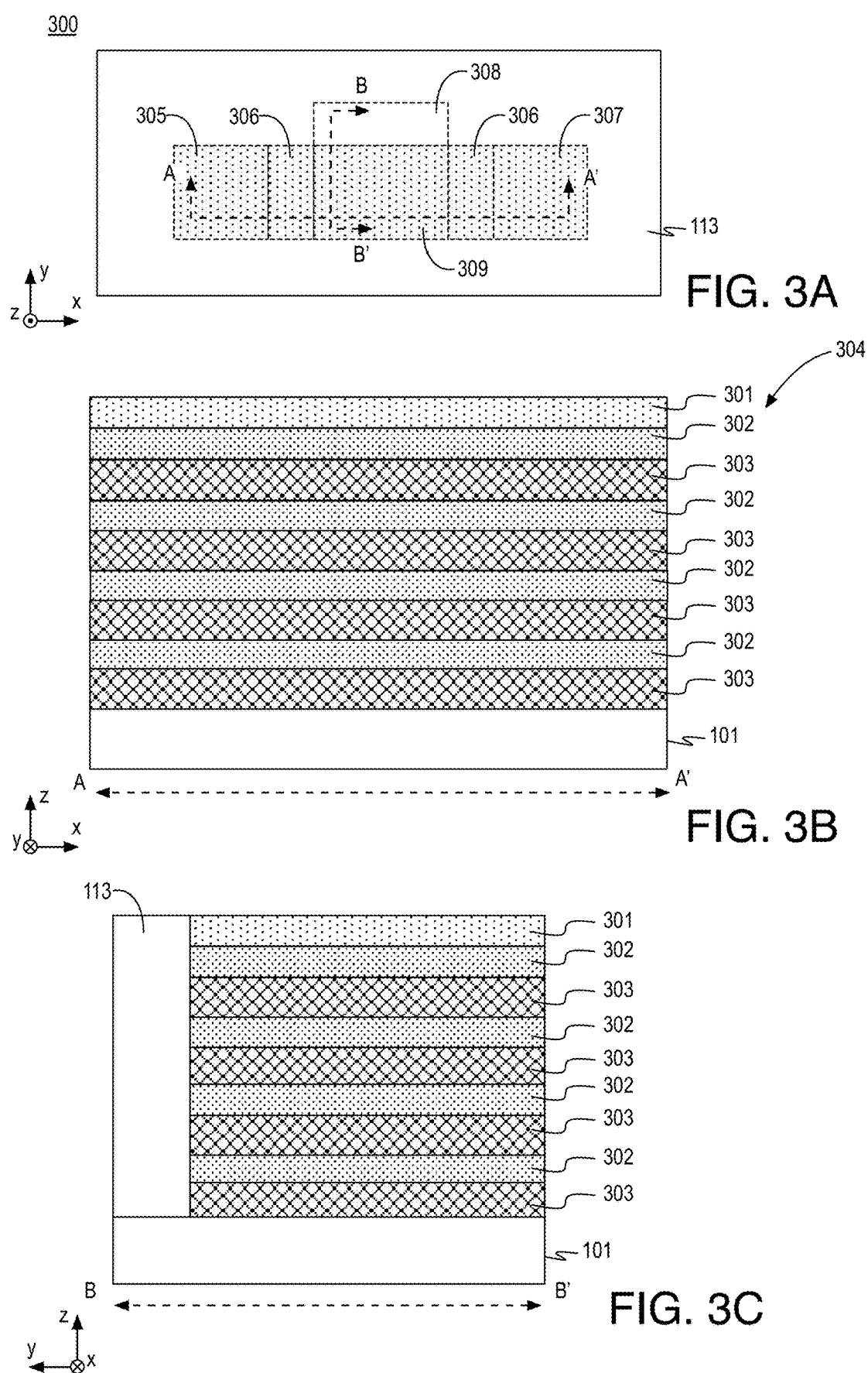
FIGS. 3A, 4A, 5A, 6A, 7A, 8A, 9A, 10A, 11A, 12A, 13A, 14A, 15A, 16A, and 17A illustrate top down views of example transistor structures as particular fabrication operations of the process of FIG. 2.
FIGS. 3B, 4B, 5B, 6B, 7B, 8B, 9B, 10B, 11B, 12B, 13B, 14B, 15B, 16B, and 17B illustrate cross-sectional side views of the transistor structures of FIGS. 3A, 4A, 5A, 6A, 7A, 8A, 9A, 10A, 11A, 12A, 13A, 14A, 15A, 16A, and 17A taken along the channel thereof.
FIGS. 3C, 4C, 5C, 6C, 7C, 8C, 9C, 10C, 11C, 12C, 13C, 14C, 15C, 16C, and 17C illustrate cross-sectional side views of the transistor structures of FIGS. 3A, 4A, 5A, 6A, 7A, 8A, 9A, 10A, 11A, 12A, 13A, 14A, 15A, 16A, and 17A taken across the gate thereof.

FIGS. 3A, 3B, and 3C illustrate an example received transistor structure 300, after the formation of an exemplary material stack 304 of alternating sacrificial layers 302, 303. As shown, material stack 304 includes alternating or interleaved layers of first sacrificial layers 302 (e.g., of a first material), and second sacrificial layers 303 (e.g., of a second material). Notably, alternating sacrificial layers 302, 303 have an etch selectivity therebetween. In some embodiments, sacrificial layers 302 include aluminum nitride and sacrificial layers 303 include gallium nitride (or vice versa). In some embodiments, sacrificial layers 302 include an oxide and sacrificial layers 303 include a nitride (or vice versa). Sacrificial layers 302, 303 may have any suitable thickness such as thicknesses in the range of about 10 to 30 nm. Sacrificial layers 302, 303 may have the same thicknesses or they may be different. Also as shown, material stack 304 is formed within an opening of a field insulator 113 such as s field oxide. Material stack 304 also includes a capping layer 301, which may include the same material as field insulator 113, a low k dielectric, or other dielectric material. Such structures may be formed using any suitable technique or techniques. In some embodiments, field insulator 113 is bulk deposited and patterned using lithography techniques. Material stack 304 is then grown using known deposition techniques such as chemical vapor deposition (CVD). In some embodiments, an optional planarization operation is then deployed.

As shown with respect to FIG. 3A, regions of transistor structure 300 may be defined including a source contact region 305, heterogeneous 2D contact regions 306, a channel region 309, a drain contact region 307, and a gate contact region 308. Notably, such regions define the locations of eventual transistor components such that channel region 309 is to include interleaved semiconductor channel layers and gate layers, heterogeneous 2D contact regions 306 are to include heterogeneous 2D materials epitaxial to the semiconductor channel layers, source and drain contact regions 305, 307 are to receive metal plugs that contact the heterogeneous 2D materials of 2D contact regions 306, and gate contact region 308 is to receive a gate metal to contact the gate electrode layers of channel region 309. Such regions may have any suitable lateral dimensions. In some embodiments, the x-dimension of channel region 309 is not more than 15 nm. In some embodiments, the x-dimension of channel region 309 is not more than 10 nm. In some embodiments, the y-dimension of channel region 309 is about that of the x-dimension thereof. Source contact region 305, drain contact region 307, and gate contact region 308 may have the same or similar dimensions with contact region 308 having a reduced y-dimension. Furthermore, heterogeneous 2D contact regions 306 may have an x-dimension in the range of about 3 to 5 nm. Other components sizes may be implemented. In subsequent FIGS. such regions are not labeled for the sake of clarity and instead the pertinent material of such regions in the top down view are labeled.

Returning to FIG. 2, processing continues at operation 202, where source and drain contact openings are patterned to expose or access the stack of alternating sacrificial layers formed at operation 201. Notably, the stack of alternating sacrificial layers are exposed at sidewalls thereof and also include sidewalls that are not exposed or accessed. For example, windows that will later be used for contact plug fill (e.g., source and drain contact plugs) may be patterned and anisotropically etched down to the substrate for later selective etch of ones of the alternating sacrificial layers. The materials of source and drain contact regions 305, 307 may be removed using any suitable technique or techniques such as lithography and anisotropic etch techniques.

Figures 4A, 4B, 4C:
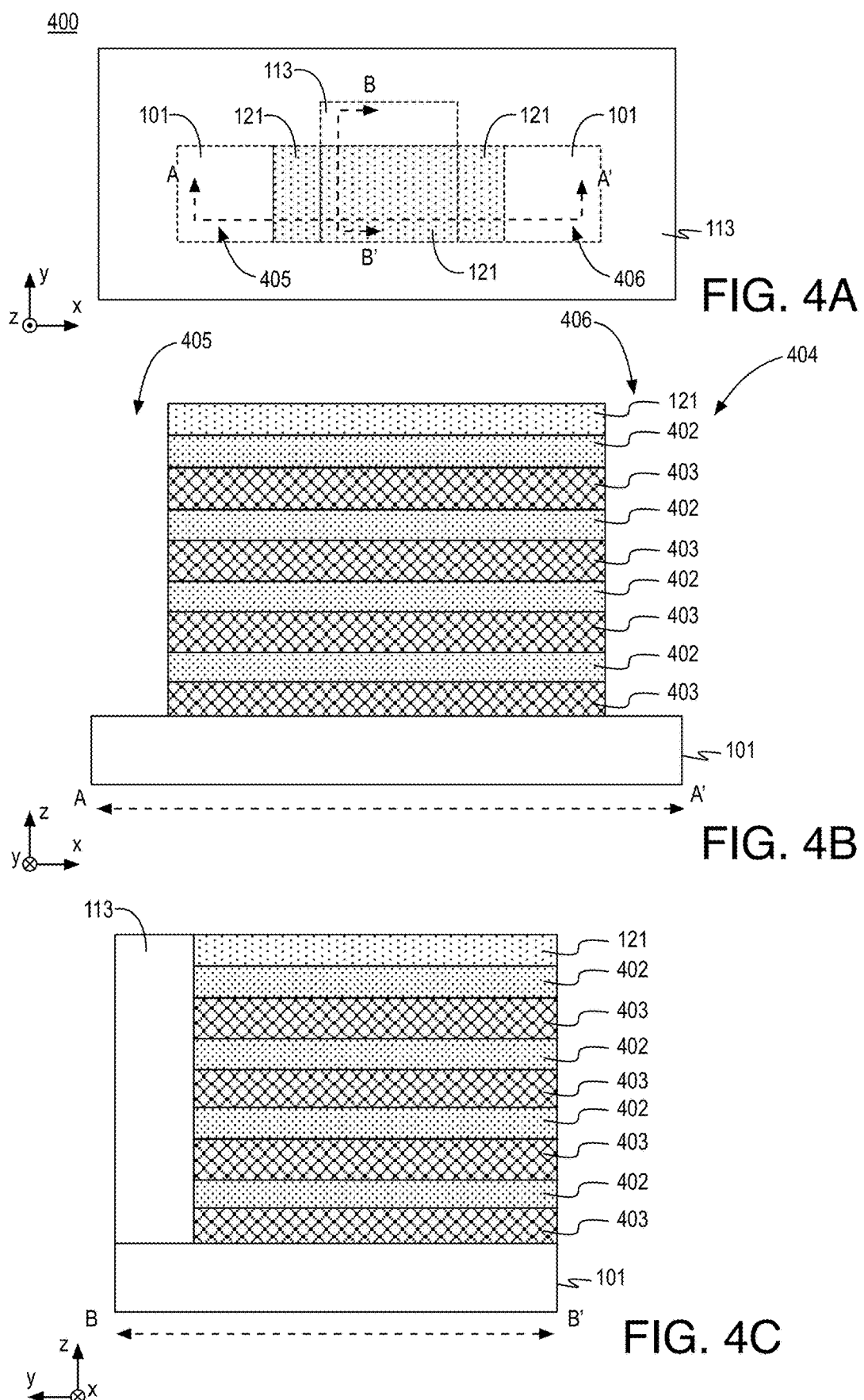

FIGS. 4A, 4B, and 4C illustrate an example transistor structure 400 similar to transistor structure 300, after patterning to remove materials from source contact region 305 and drain contact region 307 to form openings 405, 406 and to form a material stack 404 inclusive of alternating patterned sacrificial layers 402, 403, which have characteristics similar to those of sacrificial layers 302, 303. As discussed, such patterning may be performed using any suitable technique or techniques such as lithography and anisotropic etch techniques.

Returning to FIG. 2, processing continues at operation 203, where one set of the alternating sacrificial layers formed at operation 201 are selectively etched. Such selective etch may be performed using any suitable technique or techniques such as selective isotropic wet etch techniques. The remaining other set of the alternating sacrificial layers are anchored against the field dielectric and provide openings and surfaces for the growth of channel semiconductor material layers, gate dielectric layers, and gate electrode layers as discussed below.

Figures 5A, 5B, 5C:
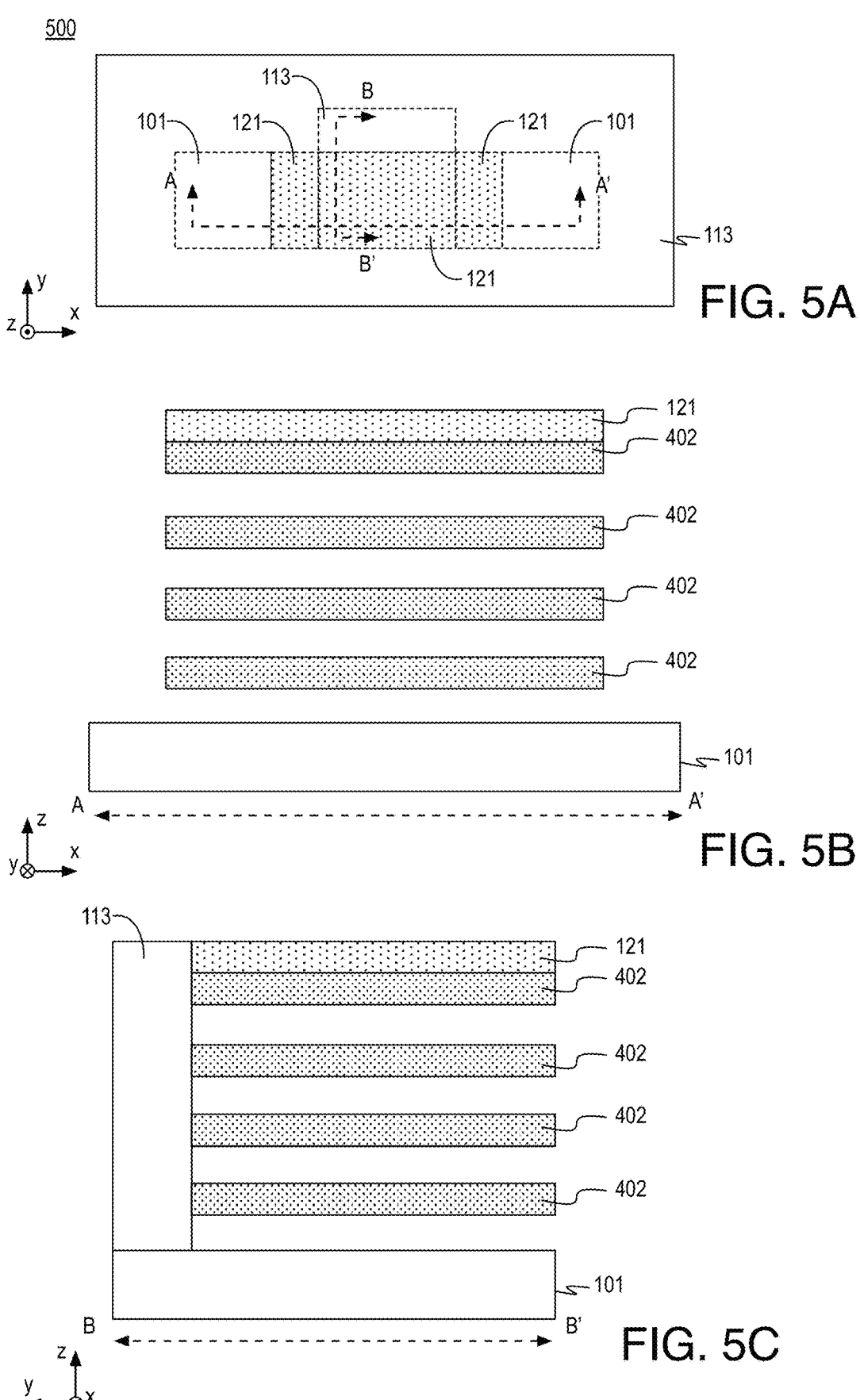

FIGS. 5A, 5B, and 5C illustrate an example transistor structure 500 similar to transistor structure 400, after removal of patterned sacrificial layers 403, leaving patterned sacrificial layers 402. Notably, surfaces of patterned sacrificial layers 402 provide surfaces for the growth of channel semiconductor material layers inclusive of 2D materials. Such patterned sacrificial layers 403 may be removed using any suitable technique or techniques such as highly selective wet etch techniques that remove patterned sacrificial layers 403 while leaving all or substantial portions of patterned sacrificial layers 402.

Returning to FIG. 2, processing continues at operation 204, where 2D channel semiconductor material is grown selectively on the exposed surfaces of the remaining sacrificial layers, gate dielectric layers are grown selectively on the channel semiconductor material layers, and gate electrode layers (or fill) are grown selectively on the gate dielectric layers. Such depositions may be performed using any suitable technique or techniques. In some embodiments, the 2D channel semiconductor material is formed by a CVD or metal organic chemical vapor deposition (MOCVD) process. In some embodiments, the 2D channel semiconductor material is formed by an atomic layer deposition (ALD) process. Depending on processing embodiments, the chemical synthesis may use a solid or a gaseous precursor. In one embodiment, a CVD process utilizes a solid precursor such as a transition metal oxide and a pure chalcogen in a CVD furnace or similar processing chamber. In MOCVD embodiments, chemical synthesis may use gaseous precursors. The 2D channel semiconductor material may include one or more monolayers formed using such techniques and may have any thicknesses discussed herein such as thicknesses of not more than 2 nm or not more than 1 nm. The gate dielectric layers are then formed using any suitable technique or techniques such as deposition techniques inclusive of CVD. Similarly, the gate electrode layers are then formed using any suitable technique or techniques such as deposition techniques.

Figures 6A, 6B, 6C:
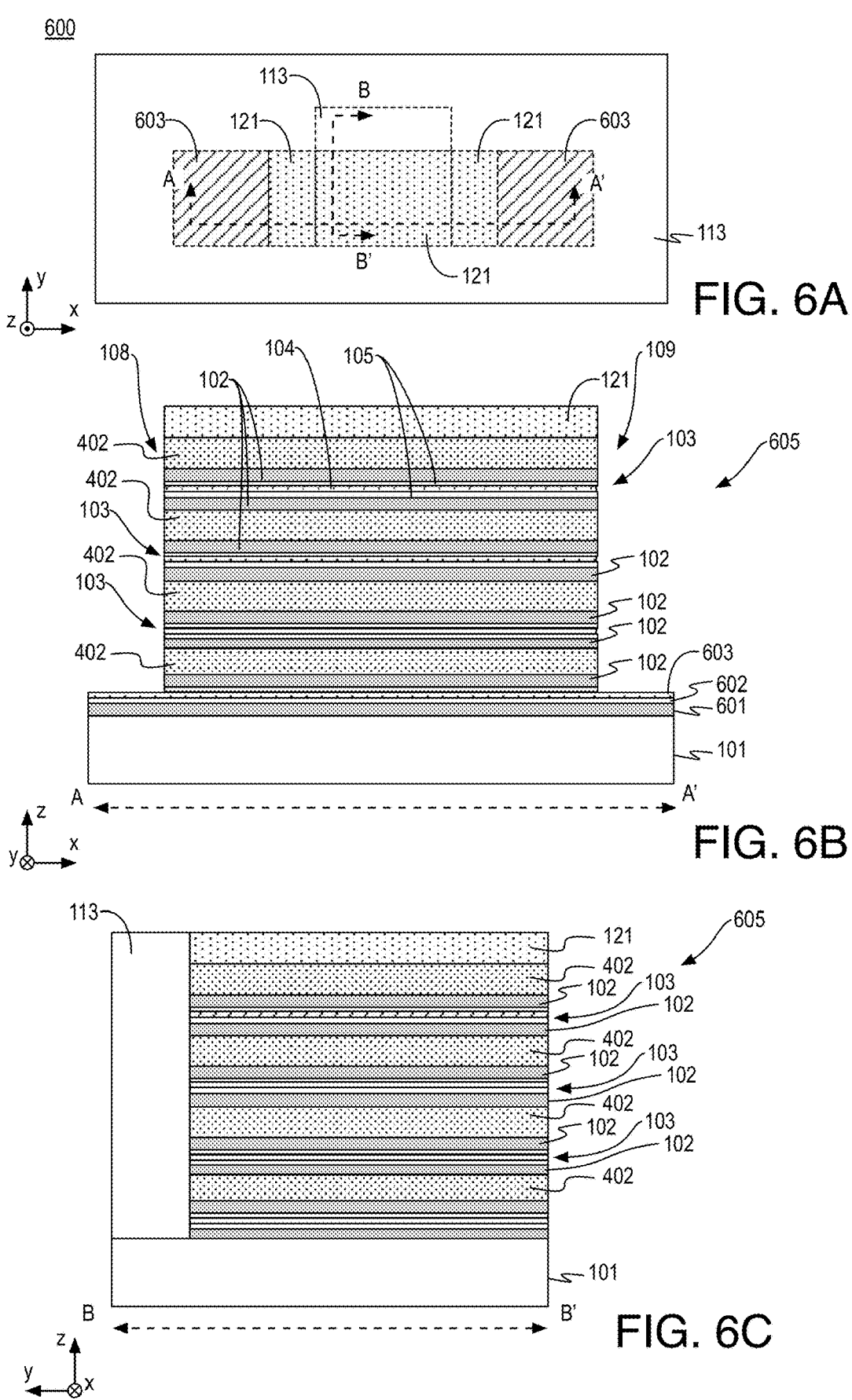

FIGS. 6A, 6B, and 6C illustrate an example transistor structure 600 similar to transistor structure 600, after deposition of 2D channel semiconductor layers, gate dielectric layers, and gate electrode layers to form a material stack 605. As shown, semiconductor channel layers 102 are formed on exposed horizontal surfaces of patterned sacrificial layers 402 using techniques discussed with respect to operation 204. Semiconductor channel layers 102 may have any characteristics discussed with respect to FIGS. 1A, 1B, and 1C or elsewhere herein.

After deposition of semiconductor channel layers 102, gate dielectric layers 105 layers are deposited. Subsequently, gate electrode layers 104 are formed. Notably, formed gate layers 103 each include one of gate electrode layers 104 sandwiched between two of gate dielectric layers 105 such that gate dielectric layers 105 are each on adjacent ones of semiconductor channel layers 102. That is, each space between adjacent patterned sacrificial layers 402 are filled with 2D semiconductor, gate dielectric material (e.g., high-k gate dielectric), and gate electrode material (e.g., a metal gate). Also as shown, a semiconductor channel layer 601, a gate dielectric layer 602, and a gate electrode layer 603 may be formed on substrate 101. Such layers may be inoperable portions of the transistor structure or they may later be patterned and incorporated into the device.

Returning to FIG. 2, processing continues at operation 205, where the second set of the alternating sacrificial layers formed at operation 201 are selectively etched. That is, the set not etched at operation 203 are selectively etched. Such selective etch may be performed using any suitable technique or techniques such as selective isotropic wet etch techniques.

Figures 7A, 7B, 7C:
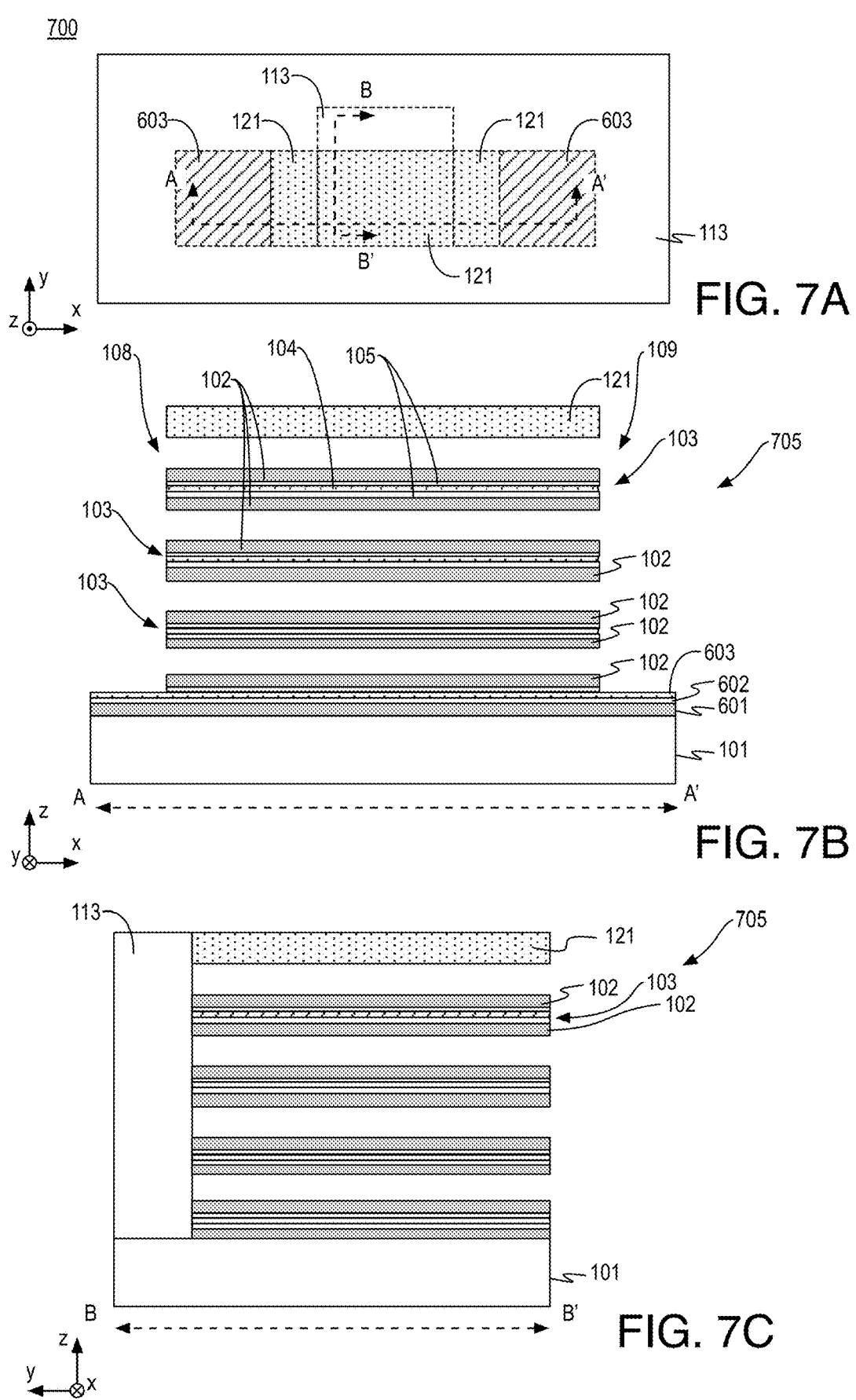

FIGS. 7A, 7B, and 7C illustrate an example transistor structure 700 similar to transistor structure 600, after removal of patterned sacrificial layers 402, leaving semiconductor channel layers 102, gate dielectric layers 105 layers, and gate electrode layers 104. Such selective etching exposes one surface of each of semiconductor channel layers 102 with the other surface being covered by one of gate dielectric layers 105. For example, material stack 705 includes groupings of a single gate electrode layer 104 sandwiched between two gate dielectric layers 105, which are further sandwiched between two semiconductor channel layers 102 while the outside surfaces of the pair of semiconductor channel layers 102 are exposed.

Returning to FIG. 2, processing continues at operation 206, where gate dielectric layers are grown on the exposed surfaces of the channel semiconductor material layers and gate electrode layers (or fill) are grown selectively on the gate dielectric layers. Such depositions may be performed using any suitable technique or techniques. In some embodiments, the gate dielectric layers and gate electrode layers are formed using CVD techniques.

Figures 8A, 8B, 8C:
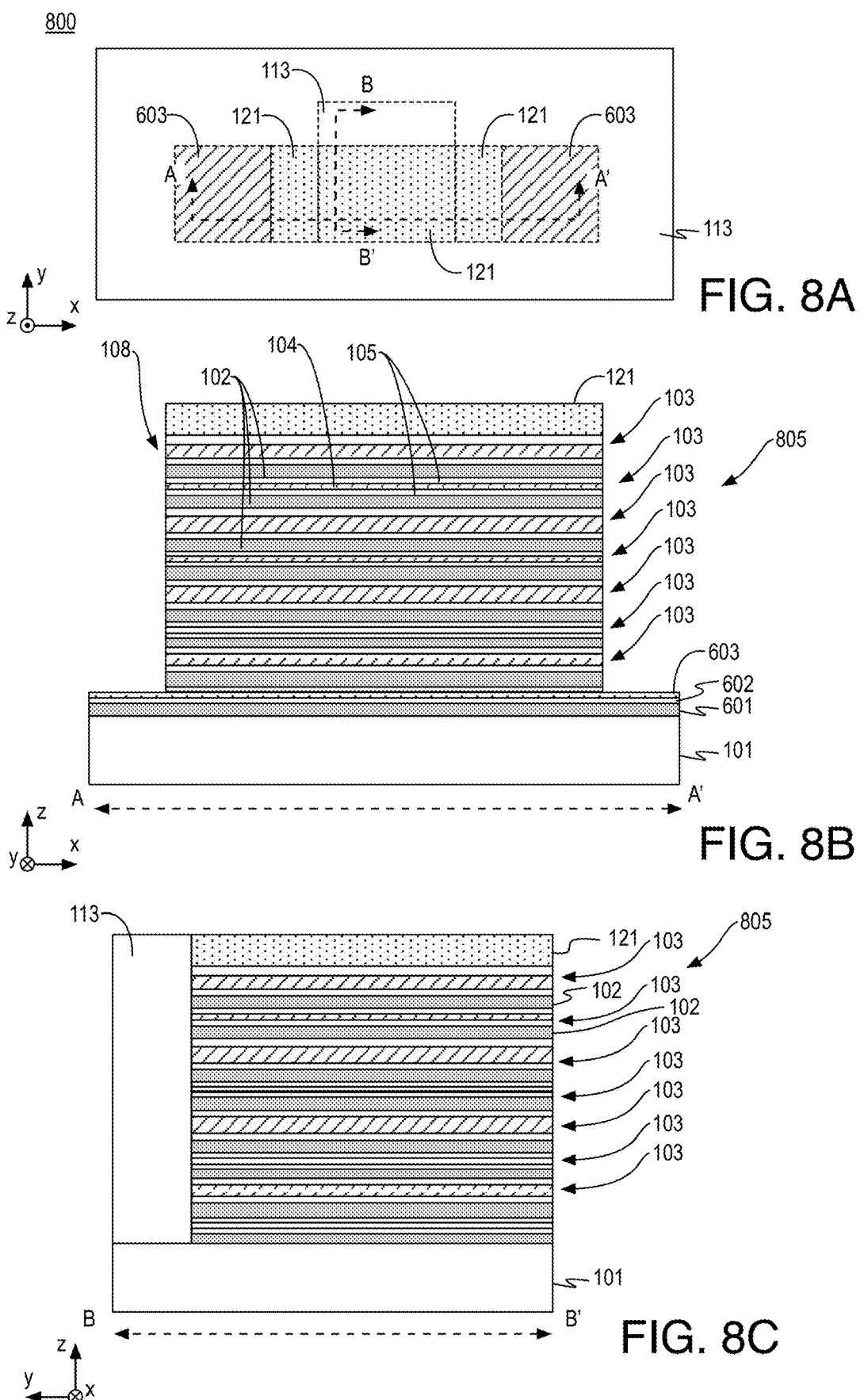

FIGS. 8A, 8B, and 8C illustrate an example transistor structure 800 similar to transistor structure 700, after deposition of gate dielectric layers on the exposed channel semiconductor material layers and gate electrode layers within openings between the gate dielectric layers to form a material stack 805. As shown, the remainder of gate layers 103 are formed by first depositing the remainder of gate dielectric layers 105 on exposed surfaces of semiconductor channel layers 102. Subsequently, gate electrode layers 104 are formed. As shown, each of gate layers 103 includes one of gate electrode layers 104 sandwiched between two of gate dielectric layers 105 such that gate dielectric layers 105 are each on adjacent ones of semiconductor channel layers 102. Thereby the interleaved layers of semiconductor channel layers 102, gate dielectric layers 105, and gate electrode layers 104 are formed such that semiconductor channel layers 102 may be controlled by gate electrode layers 104. Notably, the interleaved structure advantageously provides a number of semiconductor channel layers 102 that are controlled by closely adjacent gate electrode layers 104.

As shown, a second selective isotropic etch (as discussed with respect to operation 205 and FIGS. 7A, 7B, and 7C) is employed to etch out patterned sacrificial layers 402 substantially without affecting the previously formed semiconductor channel layers 102, gate dielectric layers 105, and gate electrode layers 104. The exposed regions are subsequently filled in with gate dielectric layers 105 (e.g., high-k dielectric) and gate electrode layers 104 (e.g., a metal gate material).

Returning to FIG. 2, processing continues at operation 207, where the exposed gate electrode layers are recessed in the source and drain regions and the recesses are filled with a dielectric material. Such recessing may be performed using any suitable technique or techniques such as a timed selective etch process to etch the gate metal material selectively to other materials in the stack. The dielectric fill may then be provided using any suitable technique or techniques such as selective growth techniques or growth and patterning techniques or the like. Notably, to avoid shorting gates to the source and drain contacts, a time-controlled etch, for example, of the gate metal edges is then performed, which is followed by a dielectric fill (e.g., a low-k dielectric fill) to reduce gate-source capacitance coupling.

Figures 9A, 9B, 9C:
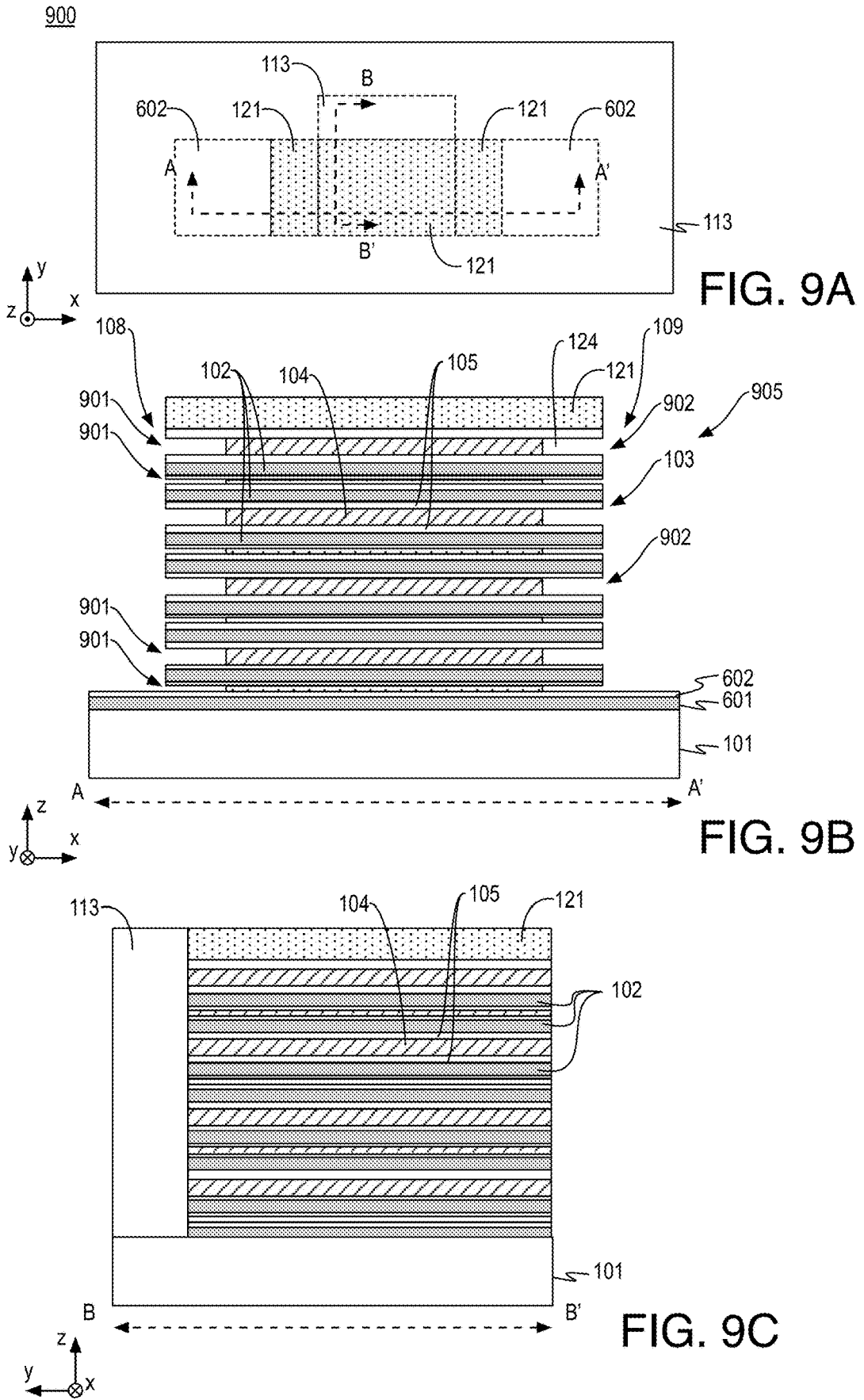

FIGS. 9A, 9B, and 9C illustrate an example transistor structure 900 similar to transistor structure 800, after recessing gate electrode layers 104 to provide recesses 901, 902 on each of opposite lateral ends 108, 109 of material stack 905, respectively. Not all of recesses 901, 902 are labeled for the sake of clarity of presentation. For example, recesses 901, 902 may be formed using timed selective etch techniques. As shown, recesses 901, 902 are at opposite lateral ends 108, 109 of gate electrode layers 104 (e.g., they are directly lateral to gate electrode layers 104). Furthermore, recesses 901, 902 are between adjacent ones of gate dielectric layers 105 such that gate dielectric layers 105 are on opposite surfaces (e.g., surfaces in the x-y plane) of the pertinent gate electrode layer 104 and gate dielectric layers 105 extend beyond an edge of the pertinent gate electrode layer 104 to encompass the recess. Such recessing provides a location for the subsequent growth of a dielectric fill material to provide an insulative material between gate electrode layers 104 and eventual source and drain metal plugs.

Figures 10A, 10B, 10C:
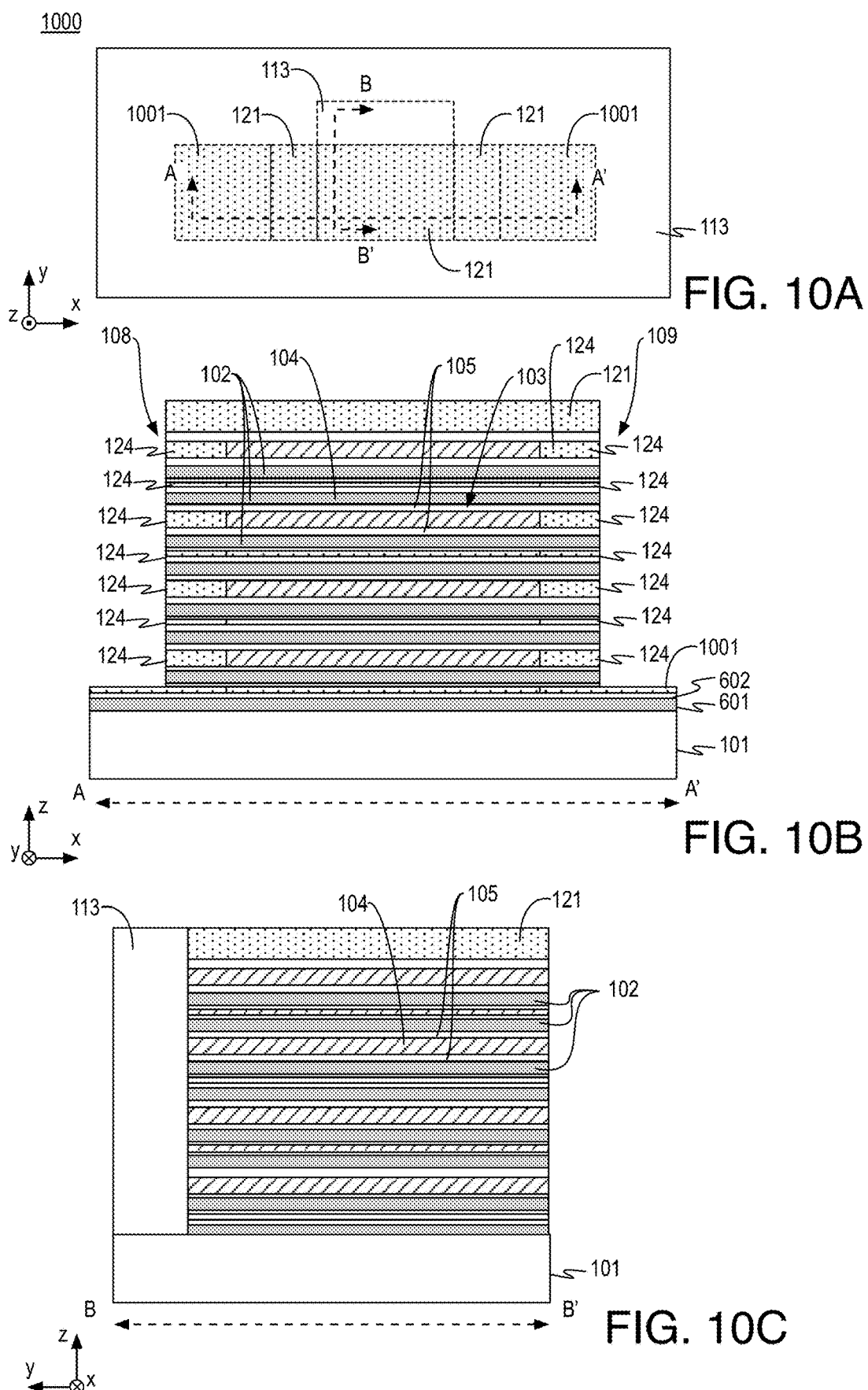

FIGS. 10A, 10B, and 10C illustrate an example transistor structure 1000 similar to transistor structure 900, after filling recesses 901, 902 with dielectric fills 124. For example, each of recesses 901, 902 are filled with dielectric fills or plugs 124. In some embodiments, the dielectric fill may also provide a dielectric layer 1001. Dielectric fills or plugs 124 are formed using any suitable technique or techniques such as selective growth techniques or growth and patterning techniques or the like. Dielectric fills 124 may include any dielectric material such as a low-k dielectric material. For example, dielectric fills or plugs 124 and capping layer 121 may have a lower dielectric constant than gate dielectric layers 105.

Returning to FIG. 2, processing continues at optional operation 208, where the exposed semiconductor channel layers are optionally recessed in the source and drain regions. Such recessing may be performed using any suitable technique or techniques such as a timed selective etch process to etch the semiconductor channel layers selectively to other materials in the stack. Notably, such processing may provide recesses for the subsequent growth of heterogeneous 2D material contacts for coupling to eventual source and drain plugs. Such recessing may provide greater lateral length of such heterogeneous 2D materials for improved device performance. However, such recess processing may be bypassed in some embodiments and the heterogeneous 2D material may be provided lateral to the semiconductor channel layers (e.g., intrinsic semiconductor 2D material) and extending into the source and drain regions for eventual contact by the source and drain plugs.

Figures 11A, 11B, 11C:
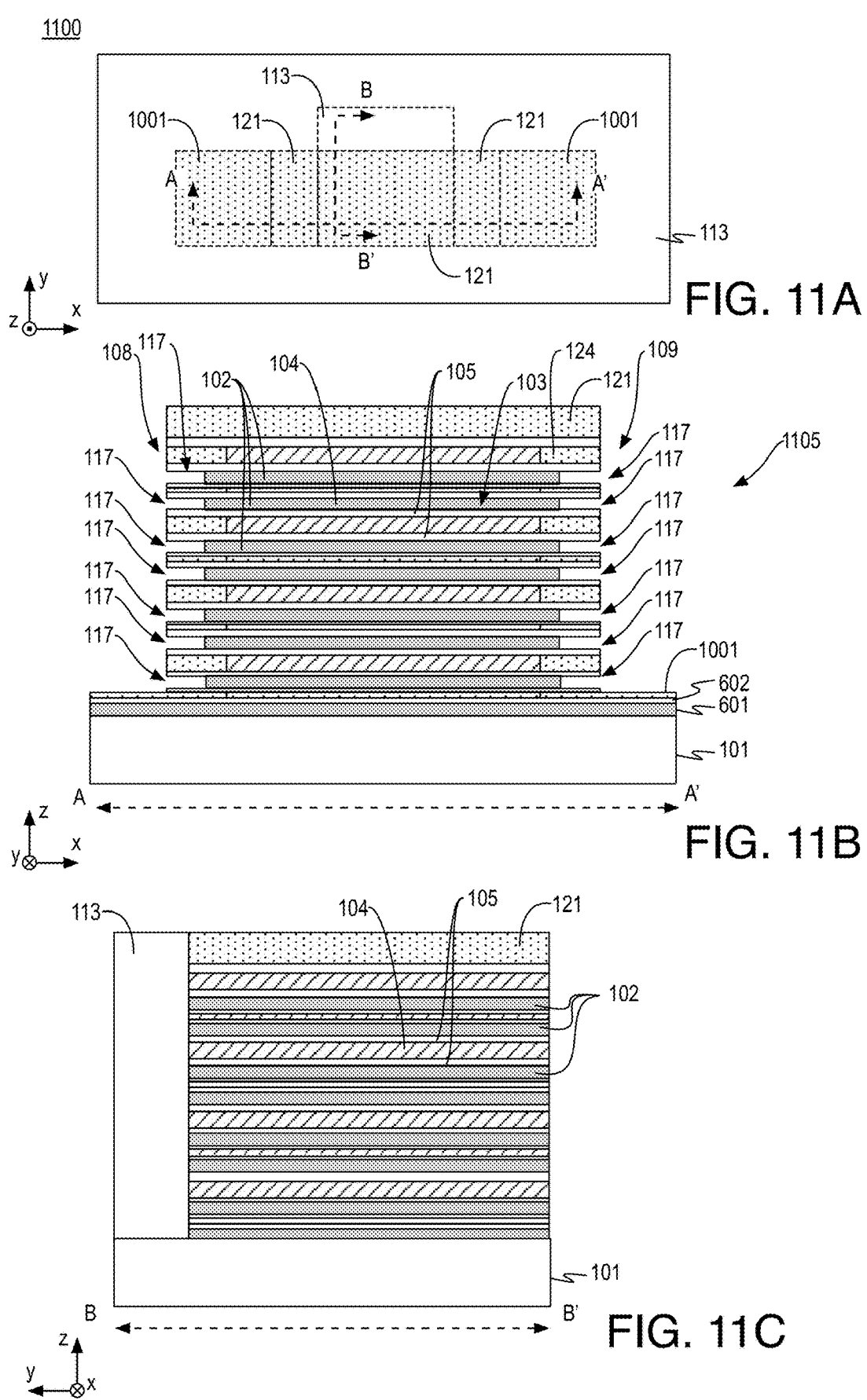

FIGS. 11A, 11B, and 11C illustrate an example transistor structure 1100 similar to transistor structure 1000, after recessing semiconductor channel layers 102 to provide recesses 117 on each of opposite lateral ends 108, 109 of material stack 1105. For example, recesses 117 may be formed using timed selective etch techniques. As shown, recesses 117 are at opposite lateral ends 108, 109 of semiconductor channel layers 102 (e.g., they are directly lateral to semiconductor channel layers 102). Furthermore, recesses 117 are between adjacent ones of gate dielectric layers 105 such that gate dielectric layers 105 are on opposite surfaces (e.g., surfaces in the x-y plane) of the pertinent semiconductor channel layer 102 and gate dielectric layers 105 extend beyond an edge of the pertinent semiconductor channel layer 102 to encompass the recess. Such recessing provides a location for the subsequent growth of a heterogeneous 2D material for reduced contact resistance via eventual contacting of the heterogeneous 2D material by source and drain metal plugs.

Returning to FIG. 2, processing continues at operation 209, where a heterogeneous 2D material is grown laterally from the channel semiconductor layers. The heterogeneous 2D material may be grown using any suitable technique or techniques such as epitaxial growth techniques. In some embodiments, the heterogeneous 2D material is formed by a CVD or MOCVD process. Depending on the material to be deposited, the chemical synthesis may use a solid or a gaseous precursor. Notably, the higher edge reactivity of the 2D materials allows for the materials to grow laterally (e.g., by in-plane covalent bonding) preferentially over depositing on other surfaces. The second 2D material (e.g., the 2D contact material) may be chosen to be a doped version of the 2D material channel, an alloy with another 2D material of lower band gap, or an entirely different (e.g. metallic) 2D material for reduction of contact resistance.

The 2D heterogeneous contact material may include any material discussed with respect to contact structures or layers 106, 107. In some embodiments, the 2D heterogeneous contact material has a greater conductivity relative to the 2D channel semiconductor layer material. In some embodiments, the 2D heterogeneous contact material has a Fermi level that lies in close proximity to the conduction or valence band edge of the material, whereas the 2D channel semiconductor layer material has a Fermi level that lies in close proximity to the intrinsic Fermi level of the material. In some embodiments, both the 2D heterogeneous contact material and the 2D channel semiconductor layer material each have a Fermi level that is within a band gap between the valence and conduction band of the materials with the band gap being narrower for the 2D heterogeneous contact material with respect to the 2D channel semiconductor layer material. For example, the 2D heterogeneous contact material may be a metallic material, a metal alloy, or a highly doped semiconductor whereas the 2D channel semiconductor layer material is an intrinsic semiconductor material. As discussed, the 2D heterogeneous contact material(s) may be grown in recesses laterally adjacent the channel semiconductor layers or the 2D heterogeneous contact material(s) may be grown on the channel semiconductor layers absent such recesses and along a sidewall of a material stack including the channel semiconductor layers.

Figures 12A, 12B, 12C:
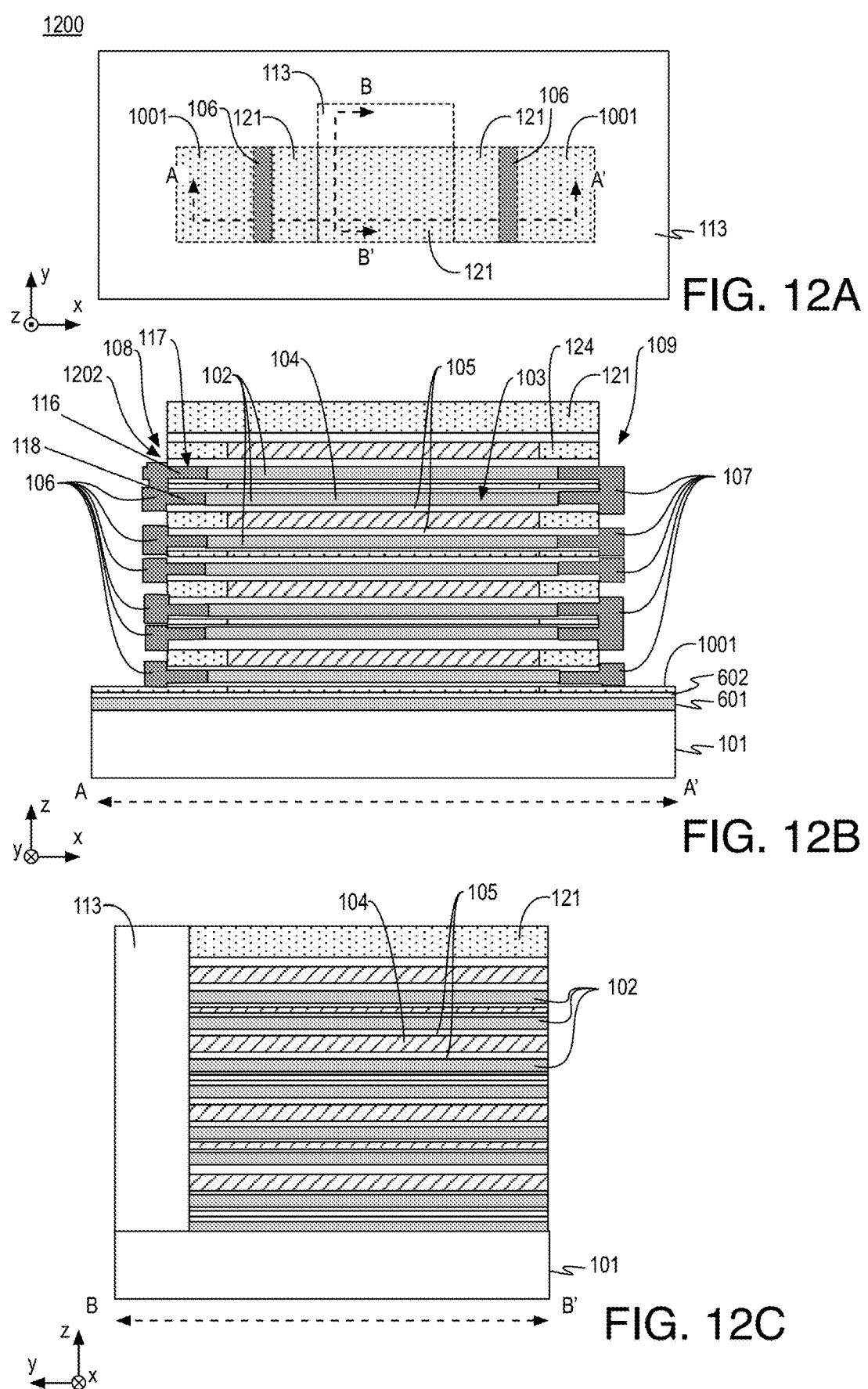

FIGS. 12A, 12B, and 12C illustrate an example transistor structure 1200 similar to transistor structure 1100, after forming contact structures or layers 106, 107 at least partially within recesses 117 and extending into source and drain regions for contact to eventual source and drain plugs. As shown, a portion such as portion 116 of each of one or more contact layers 106, 107 are within recesses 117 such that the portion is vertically between gate dielectric layers 105 that are on top surface and bottom surfaces of the portion (e.g., the portion is sandwiched therebetween) and on top and bottom surfaces of the semiconductor channel layer 102 to which the portion is on and laterally adjacent. Notably, the portion may also be epitaxial to the corresponding semiconductor channel layer 102. Each of contact structures or layers 106, 107 has one or more of such portions that are on and laterally adjacent corresponding semiconductor channel layers 102. Each portion may have a thickness (e.g., in the z-dimension) that is about that of the thickness of the corresponding semiconductor channel layer 102 such as a thickness of not more than 1 nm or not more than 2 nm. Each of contact structures or layers 106, 107 fan out from such recessed portions to bulk portions such as bulk portion 120 that are beyond a sidewall 1202 defined by edges of gate dielectric layers 105 and dielectric fills 124. As shown, such recessed portions may optionally be bridged by such bulk portions of contact structures or layers 106, 107.

As shown, in some embodiments, the edges of semiconductor channel layer 102 (e.g., the 2D semiconductor channel) are recessed and filled in with a different 2D material by MOCVD or another appropriate deposition technique. In some embodiments, the higher edge reactivity of 2D materials will allow for the materials to grow laterally via, for example, in-plane covalent bonding preferentially over depositing on other surfaces. The material of contact structures or layers 106, 107 may be any material discussed herein such as a doped version of the 2D material of semiconductor channel layer 102, an alloy with the 2D material of semiconductor channel layer 102 or another 2D material of lower band gap, or a metallic 2D material different from semiconductor channel layer 102, any of which offer reduced contact resistance for improved device performance.

Figures 13A, 13B, 13C:
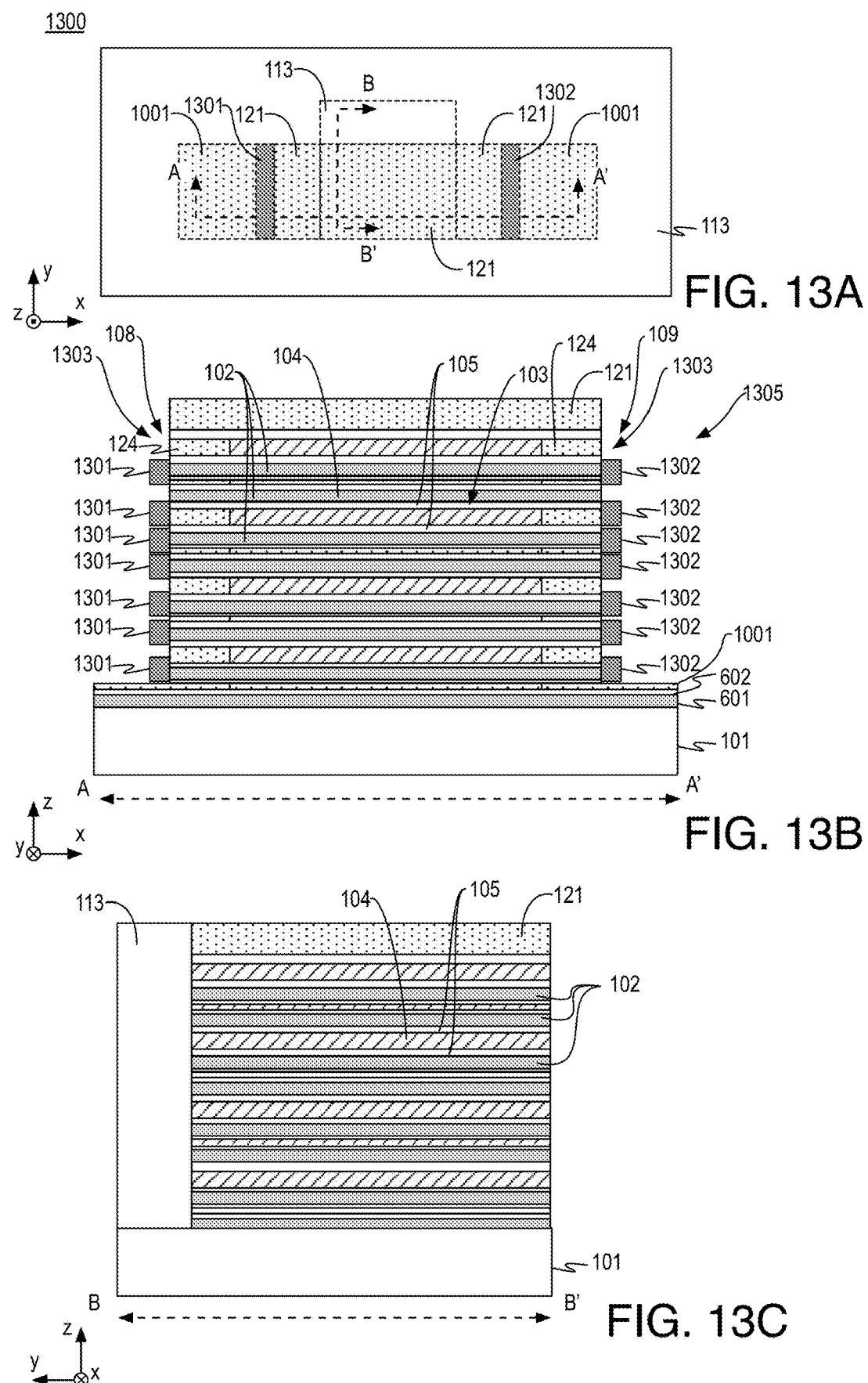

As discussed, in some embodiments, the recess processing discussed with respect to operation 208 and FIGS. 11A, 11B, and 11C may be bypassed. FIGS. 13A, 13B, and 13C illustrate an example transistor structure 1300 similar to transistor structure 1000, after forming contact structures or layers 1301, 1302 on exposed surfaces semiconductor channel layer 102. Contact structures or layers 1301, 1302 may include any material or material(s) discussed with respect to contact structures or layers 106, 107. As shown, semiconductor channel layers 102 and gate layers 103 form a material stack 1305 having sidewalls 1303 defined by gate dielectric layers 105, dielectric fills 124, and semiconductor channel layers 102. In embodiments where semiconductor channel layers 102 are not recessed, contact structures or layers 1301, 1302 are formed on and lateral to material stack 1305 (e.g., laterally epitaxial to semiconductor channel layers 102 and along or on sidewalls 1303). As with contact structures or layers 106, 107, contact structures or layers 1301, 1302 may remain discrete (and eventually be separated by contact metal) or they may bridge and combined along sidewalls 1303. In such embodiments, any of contact structures or layers 1301, 1302 may extend from one of semiconductor channel layers 102, along a first of gate dielectric layers 105, along one of gate electrode layers 104, and along a second of gate dielectric layers 105 to a second of semiconductor channel layers 102.

As discussed, contact structures or layers 1301, 1302 extend laterally from semiconductor channel layers 102. Such lateral extension may be by any lateral width such as a lateral width in the range of 1 to 8 nm. Notably, contact structures or layers 1301, 1302 may be epitaxial to the corresponding semiconductor channel layer 102 and extend into a source or drain region for eventual contact by a metal plug.

Returning to FIG. 2, processing continues at operation 210, where the source, drain, and gate contacts are formed to contact source side 2D heterogeneous material contact structures or layers, drain side 2D heterogeneous material contact structures or layers, and gate electrode layers, respectively. Such processing may open gate regions, recess the 2D semiconductor channel layers, fill the recesses, and provide gate contact metal to contact the gate electrode layers without shorting to the 2D semiconductor channel layers. Such processing may be performed with source and drain regions open (as illustrated herein) or with such source and drain regions filled with source and drain metal. In examples where the processing is performed with source and drain regions open, the subsequent source, drain, and gate metals may be the same (as illustrated herein) or they may be different. In some embodiments, a timed selective etch process is deployed to etch back the 2D semiconductor channel layers selectively such that other materials in the stack are not substantially etched. The dielectric fill may then be provided using any suitable technique or techniques such as selective growth techniques or growth and patterning techniques or the like. In some embodiments, the dielectric fill is grown selectively on the exposed gate dielectric layers. After the etch back and dielectric provides electric insulation, the gate contact is provided to contact the gate electrode layers with the 2D semiconductor channel layers insulated from potential shorts.

Figures 14A, 14B, 14C:
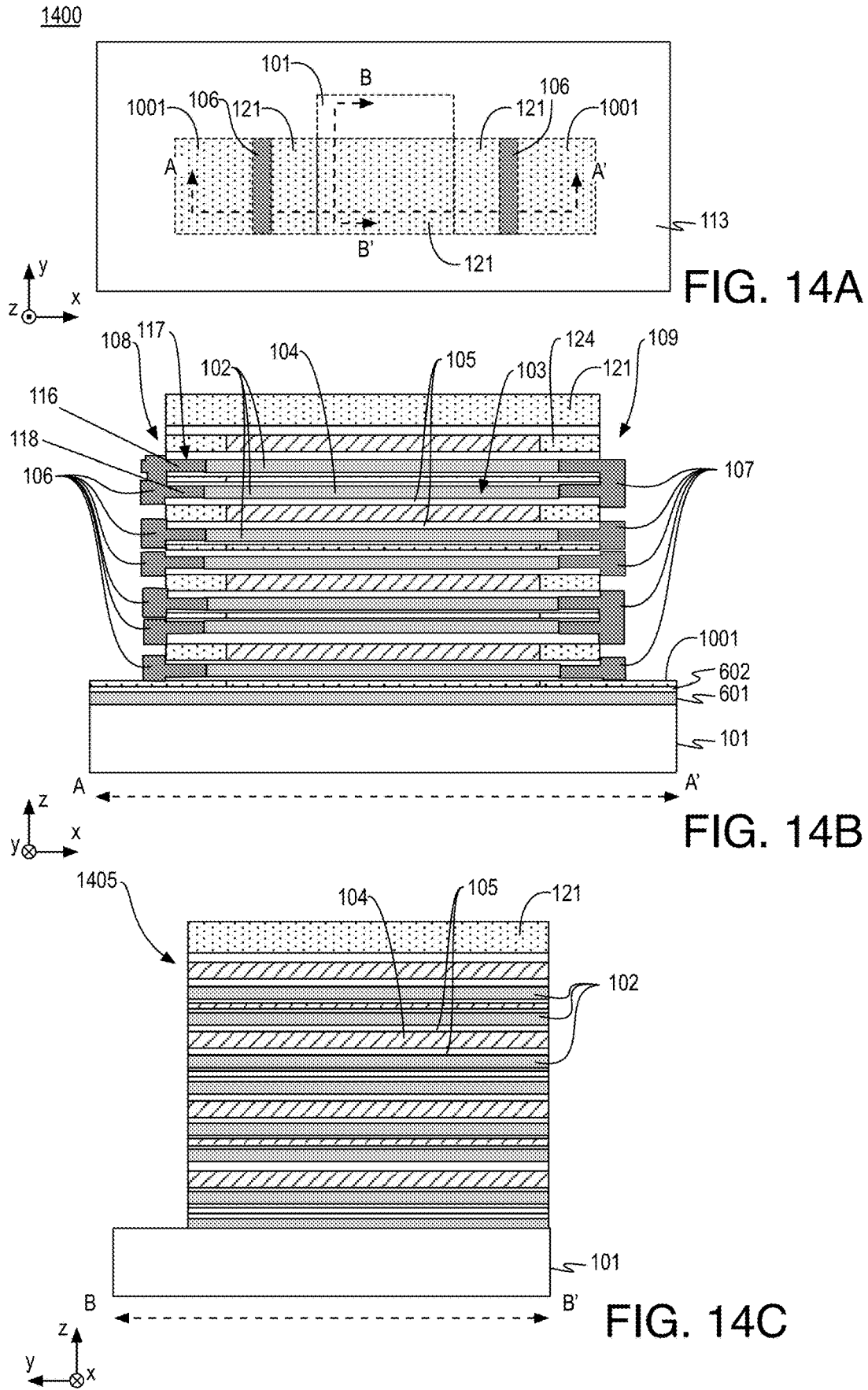

FIGS. 14A, 14B, and 14C illustrate an example transistor structure 1400 similar to transistor structure 1300, after patterning to expose gate region 308 (refer to FIG. 3). Such processing may be performed using any suitable technique or techniques such as lithography and anisotropic etch techniques. As discussed, in some embodiments, source and drain regions 305, 307 may already be filled with contact metal during such processing to provide a more planar surface. As shown, exposing the gate region 308 exposes a sidewall 1405 therein having exposed portions of gate electrode layers 104, gate dielectric layers 105, and semiconductor channel layers 102 with desired gate connection being only to gate electrode layers 104.

Figures 15A, 15B, 15C:
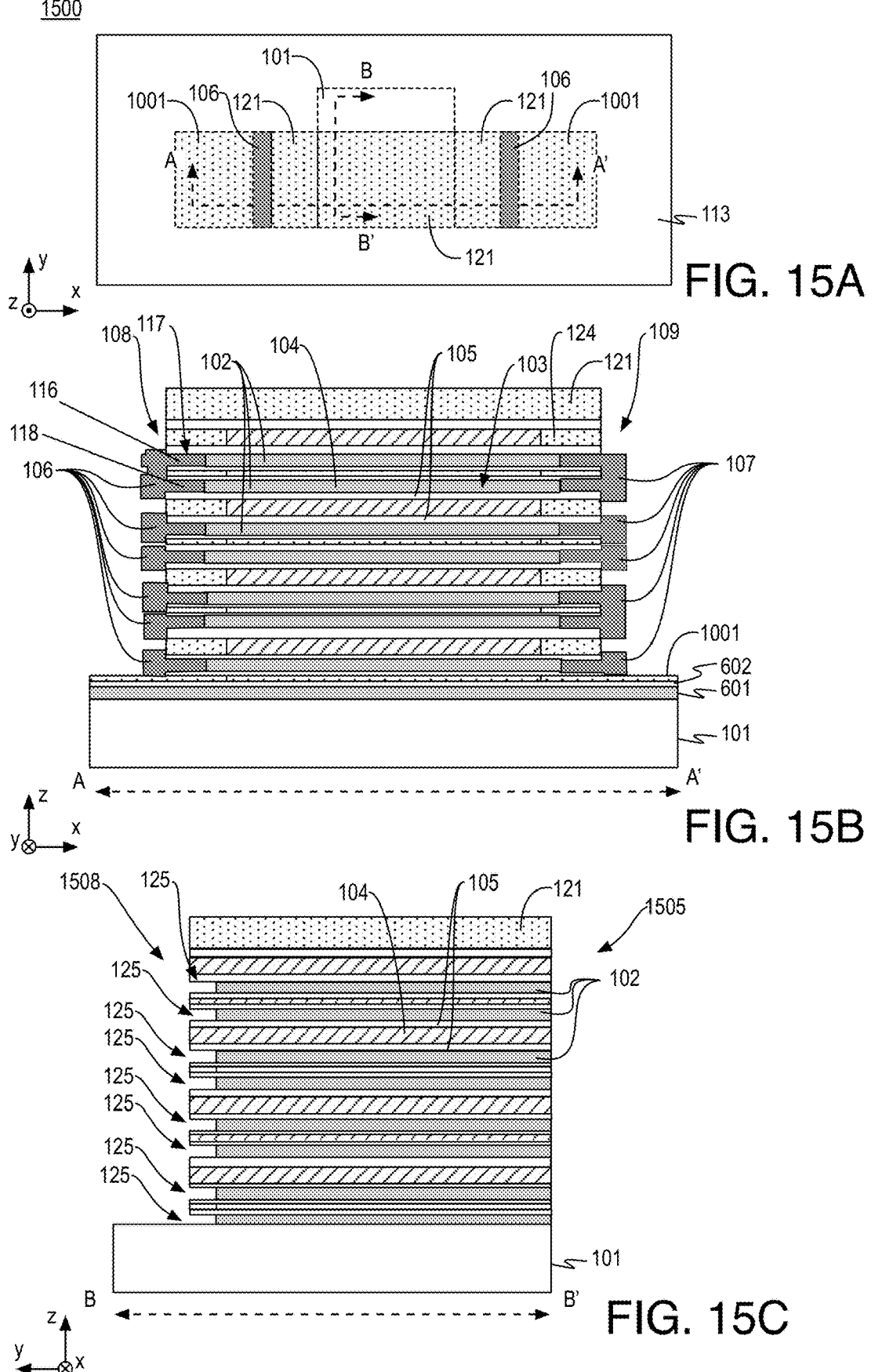

FIGS. 15A, 15B, and 15C illustrate an example transistor structure 1500 similar to transistor structure 1400, after recessing semiconductor channel layers 102 to provide recesses 125 on a lateral end 1508 of material stack 1505 adjacent the gate region (e.g., the region where gate contact metal is to land). In some embodiments, recesses 125 are formed using timed selective etch techniques. Recesses 125 are between adjacent ones of gate dielectric layers 105 such that gate dielectric layers 105 are on opposite surfaces (e.g., surfaces in the x-y plane) of one of semiconductor channel layer 102 and gate dielectric layers 105 extend beyond an edge of the semiconductor channel layer 102 to encompass the recess. Such recessing provides a location for the subsequent growth of a dielectric material to insulate semiconductor channel layers 102 from shorting to gate metallization.

Figures 16A, 16B, 16C:
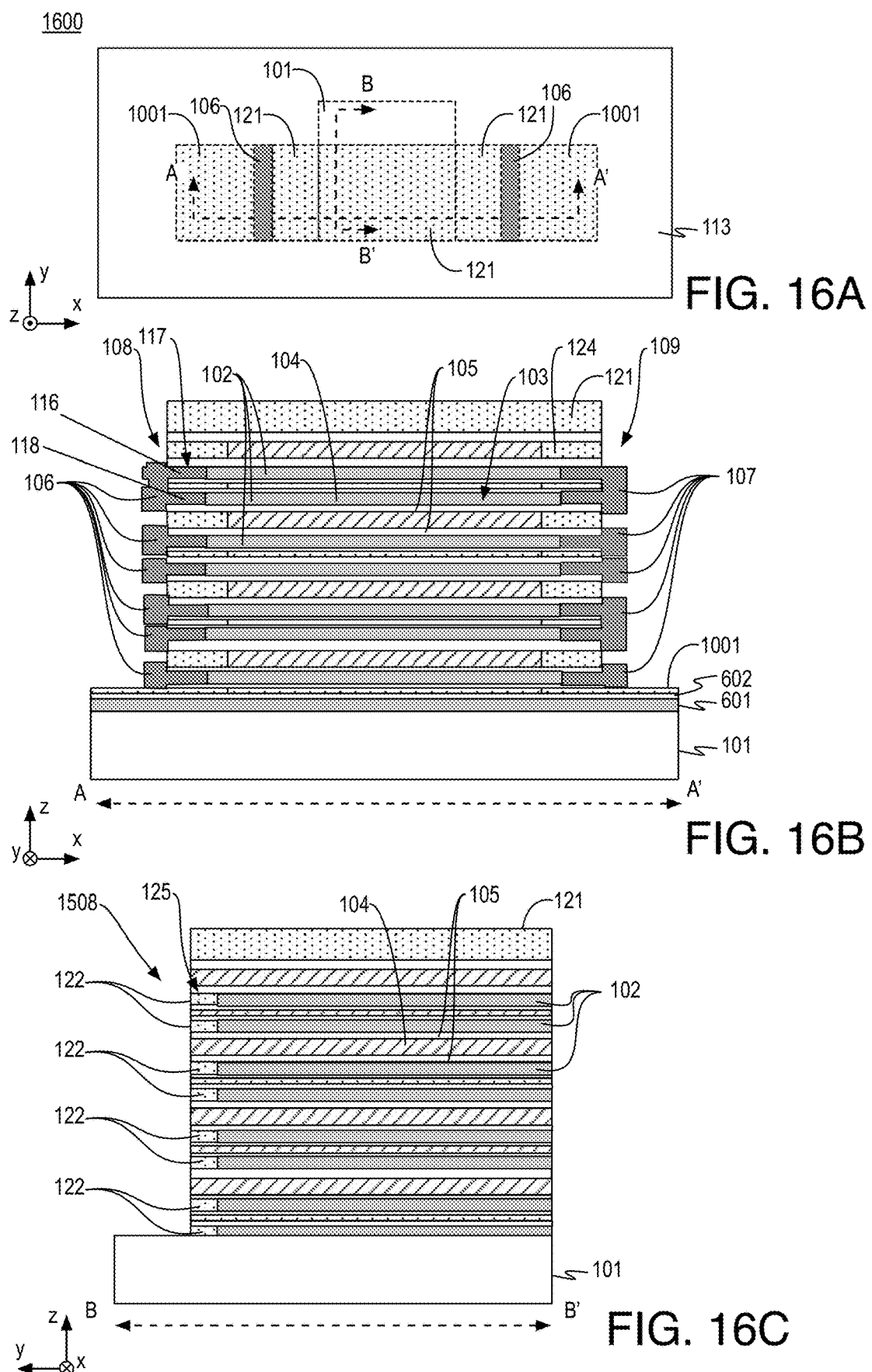

FIGS. 16A, 16B, and 16C illustrate an example transistor structure 1600 similar to transistor structure 1500, after filling recesses 125 with dielectric fills or plugs 122. For example, each of recesses dielectric fills or plugs 122 are filled with one of dielectric fills or plugs 122. Dielectric fills or plugs 122 are formed using any suitable technique or techniques such as selective growth techniques or growth and patterning techniques or the like. For example, dielectric fills or plugs 122 may be deposited with a chemistry that provides selective growth on gate dielectric layers 105. Such growth may be localized to recesses 125 or such growth may extend laterally from a sidewall at lateral end 1508 (not shown). In such examples, patterning or selective etch back may be performed or such regions may remain. Dielectric fills 122 may include any dielectric material such as a low-k dielectric material. For example, dielectric fills or plugs 122 may have a lower dielectric constant than gate dielectric layers 105.

Figures 17A, 17B, 17C:
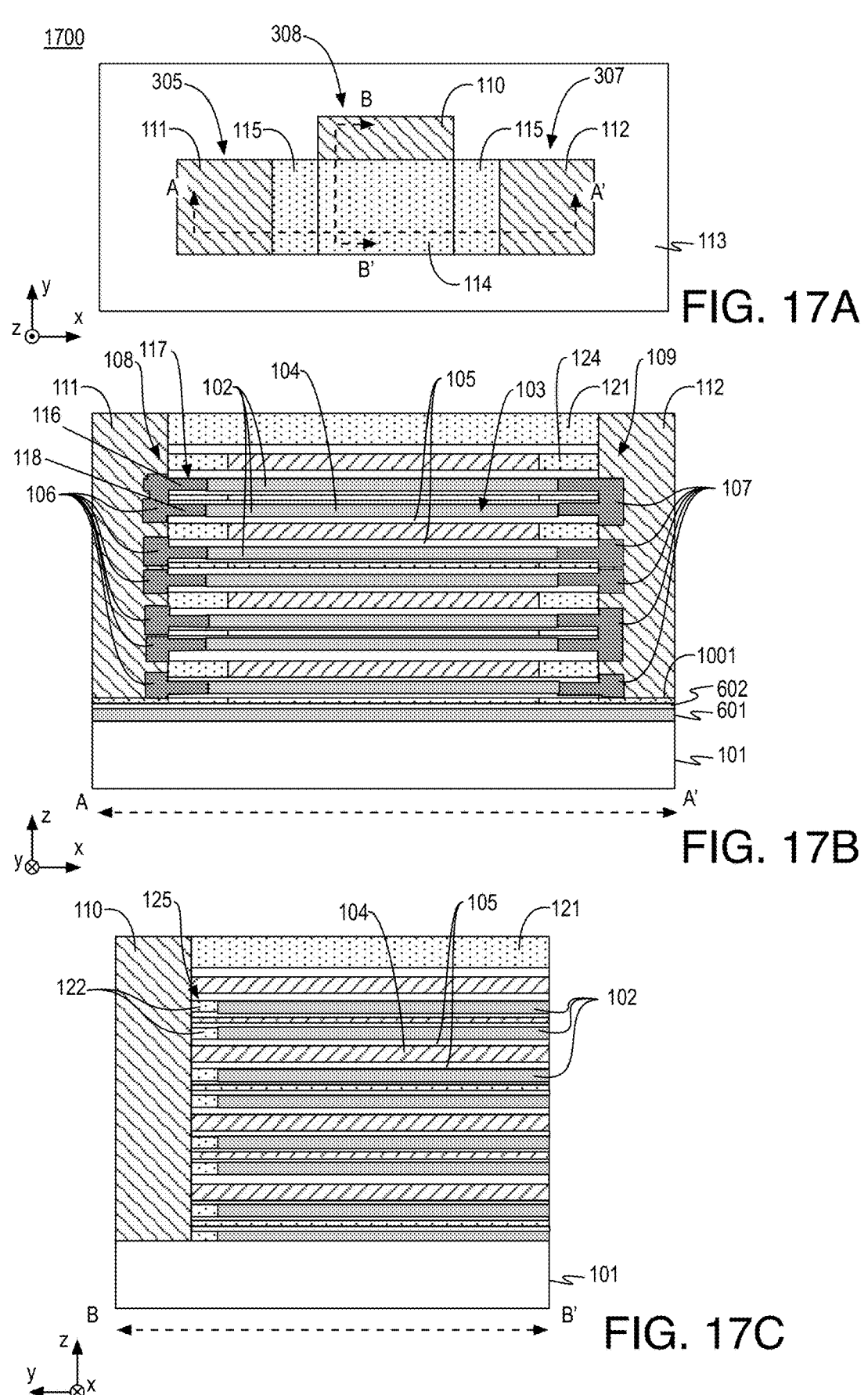

FIGS. 17A, 17B, and 17C illustrate an example transistor structure 1700 similar to transistor structure 1600, after landing source contact 111 in source region 305, drain contact 112 in drain region 307, and gate contact 110 in gate region 308. Such contacts 110, 111, 112 may have any characteristics discussed. Furthermore, contacts 110, 111, 112 may be formed using any suitable technique or techniques such as metal fill or deposition techniques followed by planarization techniques. In the illustrated example, contacts 110, 111, 112 are formed in the same operations steps and may include the same material(s). In other embodiments, source contact 111 and drain contact 112 may have been previously formed (e.g., after formation one of transistor structure 1200 or transistor structure 1300) and such gate region opening, recess processing, and dielectric plug processing is applied with source contact 111 and drain contact 112 in place. Subsequently gate contact 110 is formed. In such examples, source contact 111 and drain contact 112 may include the same material(s) while gate contact 110 includes differing material(s). It is noted that transistor structure 1700 substantially matches transistor structure 100 and may have any characteristics discussed therewith. Other techniques for forming contacts 110, 111, 112, as well as other structures of transistor structure 100 are available. Notably, the order of such operations may be provided in alternative orders, some operations may be added, or some operations may be omitted.

Figure 18:
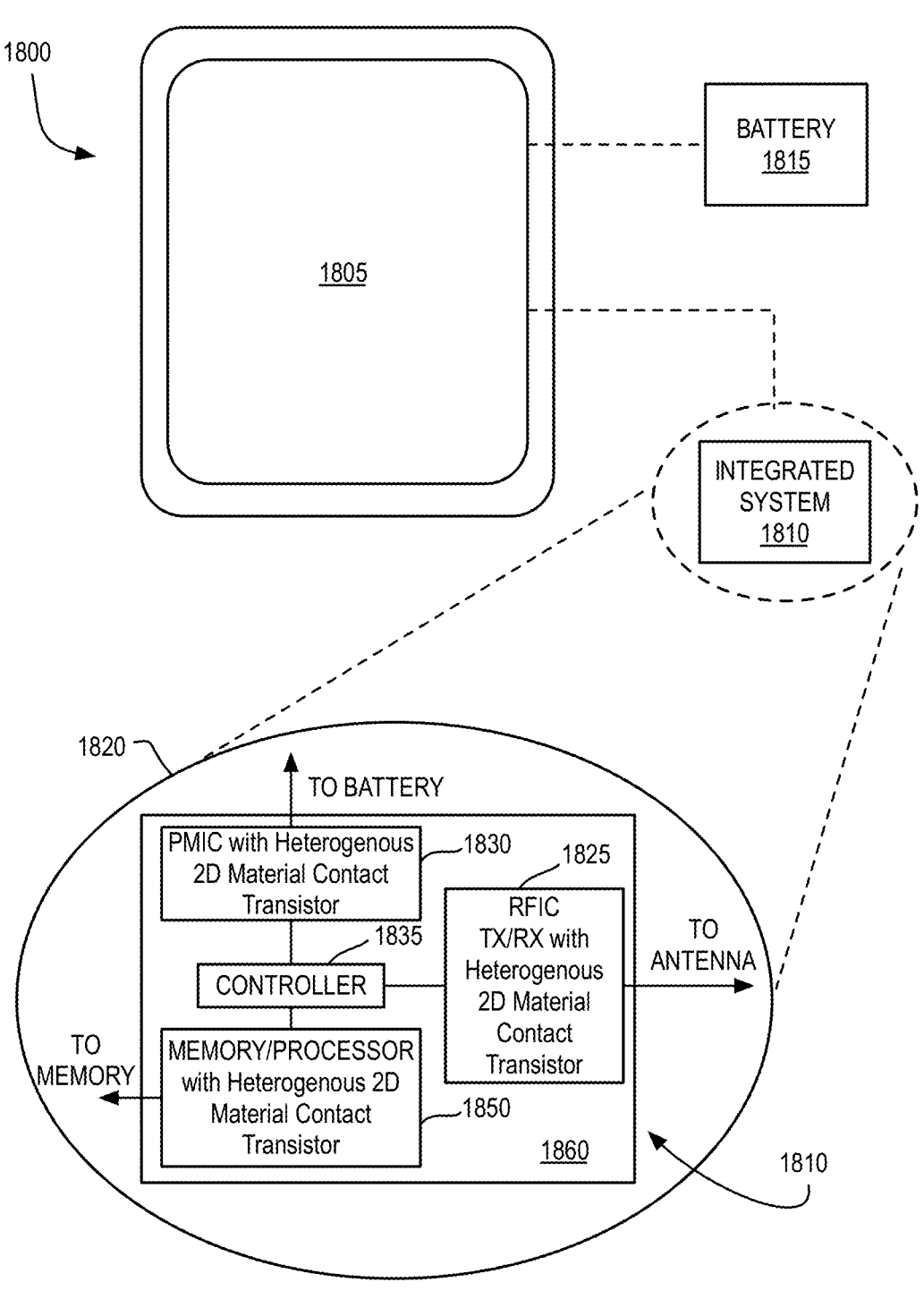
FIG. 18 is an illustrative diagram of a mobile computing platform employing a device including a transistor having semiconductor channel layers and contact layers of heterogeneous 2D materials.

FIG. 18 is an illustrative diagram of a mobile computing platform 1800 employing a device including a transistor having semiconductor channel layers and contact layers of heterogeneous 2D materials, arranged in accordance with at least some implementations of the present disclosure. Any die or device having a transistor structure inclusive of any components, materials, or characteristics discussed herein may be implemented by any component of mobile computing platform 1800. Mobile computing platform 1800 may be any portable device configured for each of electronic data display, electronic data processing, wireless electronic data transmission, or the like. For example, mobile computing platform 1800 may be any of a tablet, a smart phone, a netbook, a laptop computer, etc. and may include a display screen 1805, which in the exemplary embodiment is a touchscreen (e.g., capacitive, inductive, resistive, etc. touchscreen), a chip-level (system on chip—SoC) or package-level integrated system 1810, and a battery 1815. Battery 1815 may include any suitable device for providing electrical power such as a device consisting of one or more electrochemical cells and electrodes to couple to an outside device. Mobile computing platform 1800 may further include a power supply to convert a source power from a source voltage to one or more voltages employed by other devices of mobile computing platform 1800.

Integrated system 1810 is further illustrated in the expanded view 1820. In the exemplary embodiment, packaged device 1850 (labeled "Memory/Processor" in FIG. 18) includes at least one memory chip (e.g., RAM), and/or at least one processor chip (e.g., a microprocessor, a multi-core microprocessor, or graphics processor, or the like). In an embodiment, the package device 1850 is a microprocessor including an SRAM cache memory. As shown, device 1850 may employ a die or device having any transistor structures and/or related characteristics discussed herein. Packaged device 1850 may be further coupled to (e.g., communicatively coupled to) a board, a substrate, or an interposer 1860 along with, one or more of a power management integrated circuit (PMIC) 1830, RF (wireless) integrated circuit (RFIC) 1825 including a wideband RF (wireless) transmitter and/or receiver (TX/RX) (e.g., including a digital baseband and an analog front end module further comprises a power amplifier on a transmit path and a low noise amplifier on a receive path), and a controller 1835 thereof. In general, packaged device 1850 may be also be coupled to (e.g., communicatively coupled to) display screen 1805. As shown, one or both of PMIC 1830 and/or RFIC 1825 may employ a die or device having any transistor structures and/or related characteristics discussed herein.

Functionally, PMIC 1830 may perform battery power regulation, DC-to-DC conversion, etc., and so has an input coupled to battery 1815 and with an output providing a current supply to other functional modules. In an embodiment, PMIC 1830 may perform high voltage operations. As further illustrated, in the exemplary embodiment, RFIC 1825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1850 or within a single IC (SoC) coupled to the package substrate of the packaged device 1850.

Figure 19:
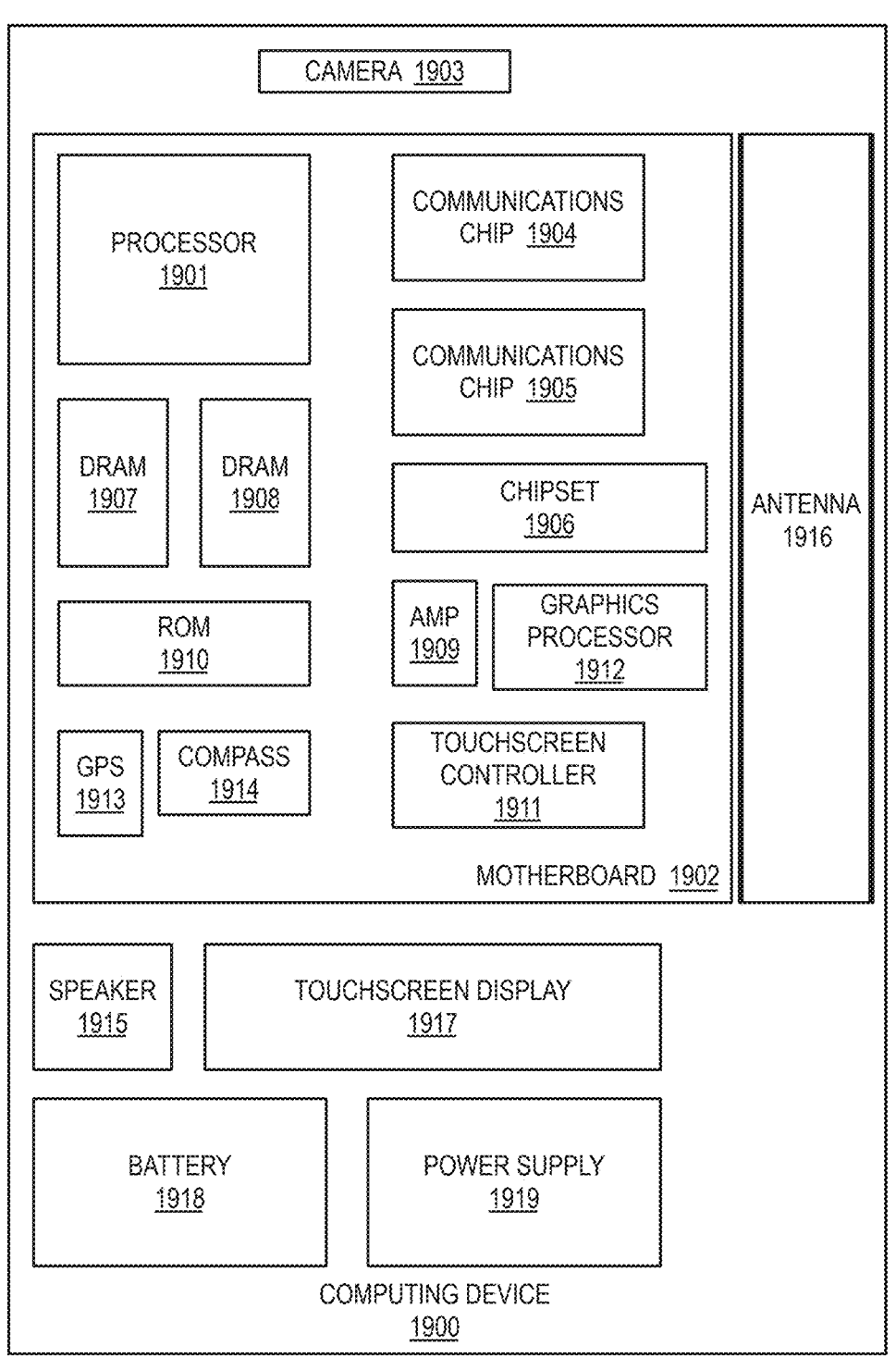
FIG. 19 is a functional block diagram of a computing device, all arranged in accordance with at least some implementations of the present disclosure.

FIG. 19 is a functional block diagram of a computing device 1900, arranged in accordance with at least some implementations of the present disclosure. Computing device 1900 may be found inside a platform 1800, for example, and further includes a motherboard 1902 hosting a number of components, such as but not limited to a processor 1901 (e.g., an applications processor) and one or more communications chips 1904, 1905. Processor 1901 may be physically and/or electrically coupled to motherboard 1902. In some examples, processor 1901 includes an integrated circuit die packaged within the processor 1901. In general, the term "processor" may refer to any device or portion of a device that processes electronic data from registers and/or memory to transform that electronic data into other electronic data that may be stored in registers and/or memory. Any one or more device or component of computing device 1900 may include a die or device having any transistor structures and/or related characteristics as discussed herein.

In various examples, one or more communication chips 1904, 1905 may also be physically and/or electrically coupled to the motherboard 1902. In further implementations, communication chips 1904 may be part of processor 1901. Depending on its applications, computing device 1900 may include other components that may or may not be physically and electrically coupled to motherboard 1902. These other components may include, but are not limited to, volatile memory (e.g., DRAM) 1907, 1908, non-volatile memory (e.g., ROM) 1910, a graphics processor 1912, flash memory, global positioning system (GPS) device 1913, compass 1914, a chipset 1906, an antenna 1916, a power amplifier 1909, a touchscreen controller 1911, a touchscreen display 1917, a speaker 1915, a camera 1903, a battery 1918, and a power supply 1919, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1904, 1905 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1904, 1905 may implement any of a number of wireless standards or protocols, including but not limited to those described elsewhere herein. As discussed, computing device 1900 may include a plurality of communication chips 1904, 1905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1919 may convert a source power from a source voltage to one or more voltages employed by other devices of mobile computing platform 1800. In some embodiments, power supply 1919 converts an AC power to DC power. In some embodiments, power supply 1919 converts an DC power to DC power at one or more different (lower) voltages. In some embodiments, multiple power supplies are staged to convert from AC to DC and then from DC at a higher voltage to DC at a lower voltage as specified by components of computing device 1900.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a transistor structure comprises a plurality of semiconductor channel layers interleaved with a plurality of gate layers, each of the plurality of gate layers comprising a gate electrode layer and a gate dielectric layer, wherein the semiconductor channel layers comprise a first 2D material, one or more first contact layers and one or more second contact layers on opposite lateral ends of the semiconductor channel layers, wherein the first and second contact layers comprise a second 2D material, a gate contact coupled to the gate electrode layers, and a source contact coupled to the one or more first contact layers and a drain contact coupled to the one or more second contact layers.

In one or more second embodiments, further to the first embodiment, one of the first contact layers comprises a portion on a first semiconductor channel layer of the plurality of semiconductor channel layers and within a recess between first and second gate dielectric layers on opposite sides of the first semiconductor channel layer.

In one or more third embodiments, further to the first or second embodiments, the one of the first contact layers comprises a second portion on a second semiconductor channel layer of the plurality semiconductor channel layers and within a second recess between third and fourth gate dielectric layers on opposite sides of the second semiconductor channel layer.

In one or more fourth embodiments, further to any of the first through third embodiments, another one of the first contact layers comprises a second portion on a second semiconductor channel layer of the plurality semiconductor channel layers and within a second recess between third and fourth gate dielectric layers on opposite sides of the second semiconductor channel layer, wherein the first and second portions are separated by a third portion of the source contact.

In one or more fifth embodiments, further to any of the first through fourth embodiments, the 2D semiconductor channel layers and gate layers comprises a material stack comprising a sidewall comprising each of semiconductor channel layers and gate layers, wherein the one or more first contact layers are on the sidewall of the material stack.

In one or more sixth embodiments, further to any of the first through fifth embodiments, the second 2D material comprises one of a highly doped 2D material, an alloyed 2D material, or a metallic 2D material.

In one or more seventh embodiments, further to any of the first through sixth embodiments, the first 2D material comprises one of a transition metal and a chalcogen or indium and selenium.

In one or more eighth embodiments, further to any of the first through seventh embodiments, the second 2D material comprises one of a doped transition metal dichalcogenide or doped indium selenide, the dopant comprising at least one of vanadium, niobium, manganese, rhenium, phosphorus, arsenic, antimony, or bromine.

In one or more ninth embodiments, further to any of the first through eighth embodiments, the second 2D material comprises a metallic 2D material comprising one of niobium and sulfur, tantalum and sulfur, tungsten and tellurium, or molybdenum and tellurium.

In one or more tenth embodiments, a system comprises a power supply and an integrated circuit die coupled to the power supply, the integrated circuit die comprising a transistor structure according to any of the first through sixth embodiments.

In one or more eleventh embodiments, a method of fabricating a transistor structure comprises forming a material stack comprising a plurality of semiconductor channel layers interleaved with a plurality of gate layers, each of the plurality of gate layers comprising a gate electrode layer between two gate dielectric layers, wherein the semiconductor channel layers comprise a first 2D material, recessing at least portions of the gate electrode layers and filling the recesses with a dielectric material, forming one or more contact layers and one or more second contact layers on opposite lateral ends of the semiconductor channel layers, wherein the first and second contact layers comprise a second 2D material, and coupling a gate electrode to the gate electrode layers, a source contact to the one or more contact layers, and a drain contact to the one or more second contact layers.

In one or more twelfth embodiments, further to the eleventh embodiment, the method further comprises recessing at least portions of the semiconductor channel layers, wherein one of the first contact layers comprises a portion on a first semiconductor channel layer of the plurality semiconductor channel layers and within a second recess between first and second gate dielectric layers on opposite sides of the first 2D semiconductor channel layer.

In one or more thirteenth embodiments, further to the eleventh or twelfth embodiments, the first 2D material comprises one of a transition metal and a chalcogen or indium and selenium.

In one or more fourteenth embodiments, further to any of the eleventh through thirteenth embodiments, the second 2D material comprises one of a doped transition metal dichalcogenide or doped indium selenide, the dopant comprising at least one of vanadium, niobium, manganese, rhenium, phosphorus, arsenic, antimony, or bromine.

In one or more fifteenth embodiments, further to any of the eleventh through fourteenth embodiments, the second 2D material comprises a metallic 2D material comprising one of niobium and sulfur, tantalum and sulfur, tungsten and tellurium, or molybdenum and tellurium.

In one or more sixteenth embodiments, further to any of the eleventh through fifteenth embodiments, forming the material stack comprises forming an alternating stack of first and second sacrificial layers over a substrate, removing the first sacrificial layers, forming the 2D semiconductor channel layers, each on an exposed surface of the second sacrificial layers, forming first gate dielectric layers on the 2D semiconductor channel layers, and forming first gate electrode layers on the first gate dielectric layers, removing the second sacrificial layers, and forming second gate dielectric layers on the 2D semiconductor channel layers, and forming second gate electrode layers on the second gate dielectric layers.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
a plurality of semiconductor channel layers interleaved with a plurality of gate layers, each of the gate layers comprising a gate electrode layer and a gate dielectric layer, wherein the semiconductor channel layers comprise a first transition metal dichalcogenide comprising a first transition metal of tungsten or molybdenum and a first chalcogen of sulfur or selenium;
first contact layers and second contact layers on opposite lateral ends of and epitaxial to the semiconductor channel layers, wherein the first and second contact layers comprise a second transition metal dichalcogenide comprising a second transition metal of niobium or tantalum and a second chalcogen of sulfur;
a gate contact coupled to the gate electrode layers; and
a source contact coupled to the first contact layers and a drain contact coupled to the second contact layers, wherein one of the first contact layers comprises a first portion on a first semiconductor channel layer of the semiconductor channel layers and within a first recess between first and second gate dielectric layers on opposite sides of the first semiconductor channel layer, another one of the first contact layers comprises a second portion on a second semiconductor channel layer of the semiconductor channel layers and within a second recess between third and fourth gate dielectric layers on opposite sides of the second semiconductor channel layer, and the first portion and the second portion are separated by and are in contact with a third portion of the source contact that separates the first portion and the second portion.

2. The apparatus of claim 1, wherein the gate electrode layers comprise ruthenium, palladium, platinum, cobalt, nickel, hafnium, zirconium, titanium, tantalum, or aluminum.

3. The apparatus of claim 1, wherein the gate dielectric layers comprise hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, or lead zinc niobate.

4. The apparatus of claim 1, wherein the gate contact comprises a polycrystalline material.

5. The apparatus of claim 1, wherein the source contact and the drain contact comprise gold, silver, platinum, or palladium.

6. The apparatus of claim 1, further comprising:
a power supply; and
an integrated circuit die coupled to the power supply, the integrated circuit die comprising the semiconductor channel layers, the gate layers, the first contact layers, the second contact layers, the gate contact, the source contact, and the drain contact.

7. An apparatus, comprising:
a plurality of semiconductor channel layers interleaved with a plurality of gate layers, each of the gate layers comprising a gate electrode layer and a gate dielectric layer, wherein the semiconductor channel layers comprise a first transition metal dichalcogenide comprising a first transition metal of tungsten or molybdenum and a first chalcogen of sulfur or selenium;
first contact layers and second contact layers on opposite lateral ends of and epitaxial to of the semiconductor channel layers, wherein the first and second contact layers comprise a second transition metal dichalcogenide comprising a second transition metal of tungsten or molybdenum and a second chalcogen of tellurium;
a gate contact coupled to the gate electrode layers; and
a source contact coupled to the first contact layers and a drain contact coupled to the second contact layers, wherein one of the first contact layers comprises a first portion on a first semiconductor channel layer of the semiconductor channel layers and within a first recess between first and second gate dielectric layers on opposite sides of the first semiconductor channel layer, another one of the first contact layers comprises a second portion on a second semiconductor channel layer of the semiconductor channel layers and within a second recess between third and fourth gate dielectric layers on opposite sides of the second semiconductor channel layer, and the first portion and the second portion are separated by and are in contact with a third portion of the source contact that separates the first portion and the second portion.

8. The apparatus of claim 7, wherein the gate electrode layers comprise ruthenium, palladium, platinum, cobalt, nickel, hafnium, zirconium, titanium, tantalum, or aluminum.

9. The apparatus of claim 7, wherein the gate dielectric layers comprise hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, or lead zinc niobate.

10. The apparatus of claim 7, wherein the gate contact comprises a polycrystalline material.

11. The apparatus of claim 7, wherein the source contact and the drain contact comprise gold, silver, platinum, or palladium.

12. The apparatus of claim 7, further comprising:
a power supply; and
an integrated circuit die coupled to the power supply, the integrated circuit die comprising the semiconductor channel layers, the gate layers, the first contact layers, the second contact layers, the gate contact, the source contact, and the drain contact.

13. An apparatus, comprising:
a plurality of semiconductor channel layers interleaved with a plurality of gate layers, each of the plurality of gate layers comprising a gate electrode layer and a gate dielectric layer, wherein the semiconductor channel layers comprise a first 2D material, the first 2D material comprising a first compound of a first metal and a first chalcogen and having a first crystalline phase;
first contact layers and second contact layers on opposite lateral ends of and epitaxial to of the semiconductor channel layers, wherein the first and second contact layers comprise a second 2D material, the second 2D material comprising a second compound of a second metal and a second chalcogen and having a second crystalline phase, wherein at least one of the second metal, the second chalcogen, or the second crystalline phase is different with respect to the first metal, the first chalcogen, or the first crystalline phase, respectively;
a gate contact coupled to the gate electrode layers; and
a source contact coupled to the first contact layers and a drain contact coupled to the second contact layers, wherein one of the first contact layers comprises a first portion on a first semiconductor channel layer of the semiconductor channel layers and within a first recess between first and second gate dielectric layers on opposite sides of the first semiconductor channel layer, another one of the first contact layers comprises a second portion on a second semiconductor channel layer of the semiconductor channel layers and within a second recess between third and fourth gate dielectric layers on opposite sides of the second semiconductor channel layer, and the first portion and the second portion are separated by and are in contact with a third portion of the source contact that separates the first portion and the second portion.

14. The apparatus of claim 13, wherein the first metal comprises indium, the first chalcogen comprises selenium, the second metal comprises one of niobium, tantalum, tungsten, or molybdenum, and the second chalcogen comprises one of sulfur or tellurium.

15. The apparatus of claim 13, wherein the first metal and the second metal comprise molybdenum, the first chalcogen and the second chalcogen comprises tellurium, the first crystalline phase is a hexagonal phase, and the second crystalline phase is a tetragonal phase.

16. The apparatus of claim 13, wherein the first metal comprises one of molybdenum or tungsten, the first chalcogen comprises one of sulfur or selenium, and the second metal comprises niobium or the second chalcogen comprises tellurium.

17. The apparatus of claim 13, wherein the gate electrode layers comprise ruthenium, palladium, platinum, cobalt, nickel, hafnium, zirconium, titanium, tantalum, or aluminum.

18. The apparatus of claim 13, wherein the gate dielectric layers comprise hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, or lead zinc niobate.

19. The apparatus of claim 13, wherein the gate contact comprises a polycrystalline material.

20. The apparatus of claim 13, wherein the source contact and the drain contact comprise gold, silver, platinum, or palladium.

21. The apparatus of claim 13, further comprising:
a power supply; and
an integrated circuit die coupled to the power supply, the integrated circuit die comprising the semiconductor channel layers, the gate layers, the first contact layers, the second contact layers, the gate contact, the source contact, and the drain contact.

* * * * *